(12) United States Patent
Fujioka et al.

(10) Patent No.: US 7,756,494 B2
(45) Date of Patent: Jul. 13, 2010

(54) RF POWER AMPLIFIER

(75) Inventors: Toru Fujioka, Tokyo (JP); Toshihiko Shimizu, Tokyo (JP); Masami Ohnishi, Hachioji (JP); Hidetoshi Matsumoto, Kokubunji (JP); Satoshi Tanaka, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 481 days.

(21) Appl. No.: 11/764,511

(22) Filed: Jun. 18, 2007

(65) Prior Publication Data

US 2007/0298736 A1 Dec. 27, 2007

(30) Foreign Application Priority Data

| Jun. 19, 2006 | (JP) | ............................. 2006-168285 |
| Jun. 26, 2006 | (JP) | ............................. 2006-175374 |
| May 31, 2007 | (JP) | ............................. 2007-145009 |

(51) Int. Cl.
*H01Q 11/12* (2006.01)

(52) U.S. Cl. .............. 455/127.1; 455/127.3; 455/127.4; 330/296

(58) Field of Classification Search .................. 455/78, 455/127.1–127.4; 330/296
See application file for complete search history.

(56) References Cited

U.S. PATENT DOCUMENTS

| 6,204,731 | B1 | 3/2001 | Jiang et al. | |
| 6,374,092 | B1 * | 4/2002 | Leizerovich et al. | ...... 455/127.4 |
| 6,615,028 | B1 * | 9/2003 | Loke et al. | ............... 455/127.1 |
| 6,954,623 | B2 | 10/2005 | Chang et al. | |
| 2001/0029168 | A1 * | 10/2001 | Yamaguchi | .................. 455/73 |

FOREIGN PATENT DOCUMENTS

JP 2004-173231 6/2004

OTHER PUBLICATIONS

"RF-MEMS Switches for Reconfigurable Integrated Circuits", by Elliot R. Brown, IEEE Transactions on Microwave Theory and Techniques, pp. 1868-1880, vol. 46, No. 11, Nov. 1998.
"Comparison of a Single-Ended Class AB, a Balance and a Doherty Power Amplifier", by Ingo Dettmann, et al., AMPC2005 Proceedings.
ISSCC98/ Session 3/ Transceivers and Power Amplifiers/ Paper TP 3.4, "A 3.6V 4W 0.2cc Si Power-MOS-Amplifier Module for GSM Handset Phones" by Isao Yoshida, et al.
"Power Amplifiers and Transmitters for RF and Microwave" by F. Raab, et al., IEEE Transactions on Microwave Theory and Techniques, vol. 50, No. 3, Mar. 2002.

* cited by examiner

*Primary Examiner*—Matthew D Anderson
*Assistant Examiner*—David Bilodeau
(74) *Attorney, Agent, or Firm*—Mattingly & Malur, P.C.

(57) ABSTRACT

The RF power amplifier includes first and second amplifiers Q1 and Q2 as final-stage amplification power devices connected in parallel between an input terminal RF_In and an output terminal RF_Out. The amplifiers Q1 and Q2 are formed on one semiconductor chip. The first bias voltage Vg1 of the amplifier Q1 is set to be higher than the second bias voltage Vg2 of the amplifier Q2 so that the amplifier Q1 is operational between Class B and AB, and Q2 is operational in Class C. The first effective device size Wgq1 of the amplifier Q1 is intentionally set to be smaller than the second effective device size Wgq2 of the amplifier Q2 beyond a range of a manufacturing error of the semiconductor chip. An RF power amplifier that exhibits a high power-added efficiency characteristic regardless of whether the output power is High or Low can be materialized.

13 Claims, 17 Drawing Sheets

|  | NONLINEAR AMPLIFICATION MODE | LINEAR AMPLIFICATION MODE |
|---|---|---|
| Bias_cont1 | A~B | A~B |
| Bias_cont2 | B~C | A~B |

|  | NONLINEAR AMPLIFICATION MODE | LINEAR AMPLIFICATION MODE |
|---|---|---|
| Bias_cont1a | A~B | A~B |
| Bias_cont1b | A~B | A~B |
| Bias_cont2a | B~C | A~B |
| Bias_cont2b | B~C | A~B |

|  | NONLINEAR AMPLIFICATION MODE | LINEAR AMPLIFICATION MODE |
|---|---|---|
| Bias_cont0 | A~B | A~B |
| Bias_cont1 | A~B | A~B |
| Bias_cont2 | B~C | A~B |

RF POWER AMPLIFIER

CLAIM OF PRIORITY

The present application claims priority from Japanese applications JP 2006-168285 filed on Jun. 19, 2006, JP 2006-175374 filed on Jun. 26, 2006 and JP 2007-145009 filed on May 31, 2007, the contents of which are hereby incorporated by reference into this application.

FIELD OF THE INVENTION

The present invention relates to an RF power amplifier for RF transmission, which is incorporated in a communication terminal tool such as a portable phone terminal for communicating with a base station, or which is used in a base station. Particularly, it relates to a technique profitable to improve the power efficiency by means of two or more final-stage amplification power devices in the RF power amplifier. The term, high-frequency power amplifier is herein equivalent to the term, RF power amplifier.

BACKGROUND OF THE INVENTION

Various communication systems are used in the world presently. Such communication systems are not necessarily the same because old and new communication systems are mixed, and the frequency and detailed specifications differ from one country to another. Therefore, to use a portable terminal in the world, the terminal needs to support various types of systems, and it is required to have therein two or more high-frequency power amplification modules supporting such systems. However, this leads to the increase in size and weight of the portable terminal. If a high-frequency amplifier (multimode amplifier), which supports two or more communication systems and has an efficiency increased, is materialized as means to solve the problem, it will be possible to reduce the size and weight of a portable terminal.

To realize the above, various methods have been reported. The examples of such methods are described in Patent Documents 1 to 4, which are to be noted later. Of those documents, Patent Documents 1 to 3 each describe a technique which includes using a Doherty amplifier. In regard to such technique, a high efficiency can be expected in a range of middle to high outputs, which can be achieved even when the output level is changed. On the other hand, Patent Document 4 describes a technique to reduce the fluctuation in output power incident to the variation in load.

In general, such RF power amplifier requires a high power-added efficiency and a high output power. Nonpatent Document 1, which is to be noted later, contains the description on an RF power amplifier in accordance with an architecture which is referred to as Wilkinson type architecture. This is because small amplification devices can provides a high gain, low matching Q factor (broad band), good phase linearity, and cost saving, even if a large amplification device is available. In accordance with the architecture, an input coupler is arranged for input terminals of such small power amplifiers, and an input power is divided to the input terminals. In addition, an output coupler is arranged for output terminals of the small power amplifiers, output powers is coupled into one output power. The input and output couplers each incorporate a λ/4-wavelength line which creates a 90-degree phase shift. As the hybrid coupler separates two power amplifiers from each other, even when one amplifier breaks down, the other can work. In Nonpatent Document 1, which is to be noted later, it is described that this RF power amplifier further provides a fixed input impedance, and allows the cancellation of odd harmonics and the cancellation of an inter-modulation distortion of an opposite direction.

In addition, Nonpatent Document 2 contains the description on an RF power amplifier in accordance with DD-CIMA (Divided Device and Collectively impedance-matched amplifier) architecture, which incorporates an LC resonant circuit instead of the λ/4-wavelength line as described in the Nonpatent Document 1. Also in this architecture, small amplification devices are used instead of one large amplification device.

Further, Nonpatent Document 1 contains the description on an RF power amplifier in accordance with an architecture which is referred to as Doherty type architecture; the RF power amplifier includes a combination of a main power amplifier biased in Class B and an auxiliary power amplifier biased in Class C. In accordance with the architecture, only the main power amplifier works, and the auxiliary power amplifier remains cut off when an input power is low. When an input amplitude rises to a middle input power, the auxiliary power amplifier is activated. A λ/4-wavelength impedance converter is connected between outputs of the two power amplifiers, which achieves a high power-added efficiency by means of load modulation by a large load when the input power is low and a small load when the input power is high.

Also, Nonpatent Document 3 contains the description that in a Doherty type RF power amplifier, two identical devices are used as a main power amplifier biased in Class AB and as an auxiliary power amplifier biased in Class C.

Further in Patent Document 4 is introduced an RF-MEMS switch based on MEMS (Micro Electromechanical System). It is reported that the switch exhibits excellent high-frequency characteristics and can be designed and manufactured by making use of a technology similar to VLSI technology.

Patent Documents 1-4 and Nonpatent Documents 1-4 are as follows.

Patent Document 1: U.S. Pat. No. 6,374,092.
Patent Document 2: JP-A-2004-173231.
Patent Document 3: U.S. Pat. No. 6,204,731.
Patent Document 4: U.S. Pat. No. 6,954,623.
Nonpatent Document 1: Frederic H. Raab et al, "Power Amplifier and Transmitter for RF and Microwave", IEEE TRANSACTIONS ON MICROWAVE THEORY AND TECHNIQUES, VOL. 50, NO. 3, MARCH 2002, PP. 814-826.
Nonpatent Document 2: Isao Yoshida et al, "A 3.6V 4 W 0.2 cc Si Power-MOS-Amplifier Module for GSM Handset Phones", 1998 IEEE International Solid State Circuits Conference DIGEST OF TECHNICAL PAPERS, PP. 50-51.
Nonpatent Document 3: Ingo Dettmann et al, "Comparison of a Single-Ended Class AB, a Balance and a Doherty Power Amplifier", 2005 IEEE Proceedings Asia-Pacific Microwave Conference Proceedings, VOL. 2, 4-7 Dec. 2005, PP. 1-4.
Nonpatent Document 4: Elliot R. Brown, "RF-MEMS Switches for Reconfigurable Integrated Circuits", IEEE TRANSACTIONS ON MICROWAVE THEORY AND TECHNIQUES, VOL. 46, NO. 11, NOVEMBER 1998, PP. 1868-1880.

SUMMARY OF THE INVENTION

In accordance with a technique described in Patent Document 1, a high-frequency power amplifier apparatus 1400 has a structure as shown in FIG. 34. Specifically, in the amplifier apparatus, the following means is adopted for amplifiers connected in parallel in order to make the Doherty amplifier effective as a linear amplifier. That is, the bias for the carrier amplifier 1410 is fixed, while only the bias for the peaking amplifier 1411 is switched at a predetermined threshold in accordance with an input signal power, whereby the linearity is improved.

However, even a high-frequency power amplifier having the structure as shown in FIG. 34 has characteristics of the power gain and power-added efficiency (PAE) with respect to the amount of input power ($P_{in}$) as shown in FIG. 35. In other words, a predetermined threshold of the amount of input power is used for switching a mode. The frequent changes of power near the threshold cause rapid changes in power gain (Gain), power-added efficiency (PAE) and phase difference.

As described above, the features of the technique as described in Patent Document 1 are: the bias is switched depending on whether or not the input signal power exceeds a previously defined threshold; one of two power amplifiers connected in parallel is fixed in bias. Therefore, the frequent changes in input power near the previously defined threshold cause the frequent switching of the bias, which leads to the rapid changes in power gain, current, phase and the like. As a result, the control system of a portable terminal and/or the entire system thereof can be affected significantly. In addition, there is a problem such that the efficiency of the amplifier apparatus working at a middle output level or lower cannot be improved only by changing the bias of one amplifier.

Also, as for techniques described in Patent Documents 2 and 3, means for improving the linearity by use of a Doherty amplifier is adopted. However, the techniques have a problem that the frequent changes in amount of input power near the predetermined threshold produce the rapid changes in power gain, power-added efficiency, phase difference, etc.

On the other hand, there is another technique as described in Patent Document 4 as an alternative of the techniques adopted in Patent Documents 1 to 3. In accordance with such technique, the variation in output power resulting from the variation in load is reduced without using an elemental component such as an isolator.

However, the technique as described in Patent Document 4 has a problem such that the range in which an optimal output impedance value can be achieved is restricted in linear amplification by the amplifier. This is because the variation in output power when the load to the amplifier varies is suppressed by means of two amplification paths having phase differences kept at +45 and −45 degrees respectively.

As multimode portable phones, in which a plurality of transmitter-receiver circuits corresponding to the respective modulation modes are switched dynamically and operated, become dominant, another problem that such multimode portable phones are required in their performance to maintain the continuity of the power gain and the continuity of the phase and to reduce the variation in output power resulting from the variation in load at the time of switching the circuits arises. However, in regard to the techniques described in Patent Documents 1 to 4, such problem is not taken into account.

Prior to the invention, the inventors had examined an LDMOS (Lateral Diffused Metal Oxide Semiconductor) transistor in the relation between the input power and the output power, and the relation between the output power and the power-added efficiency. In this case, the LDMOS transistor was a final-stage amplification power device of an RF power amplifier.

FIG. 15 is a plot showing the relation between the input power $P_{in}$ (dBm) and the output power $P_{out}$ (dBm). From the relation shown in FIG. 15, it can be understood that when the source voltage Vcc is set to a higher value as large as 5.0 volts, a higher output power $P_{out}$ (dBm) can be obtained with respect to the same input power $P_{in}$ (dBm) in comparison to the time when the source voltage Vcc is set to a lower value of 3.0 volts.

FIG. 16 is a plot showing the relation between the output power $P_{out}$ (dBm) and the power-added efficiency PAE (%). The power-added efficiency PAE (%) is given by:

$$\text{PAE}=(P_{out}-P_{in})/P_{DC} \qquad \text{[Expression 1]},$$

where $P_{out}$ is an RF output power, $P_{in}$ is an RF input power, and $P_{DC}$ is a direct current power consumption. As shown in FIG. 16, about 68% is obtained as a maximum of the power-added efficiency PAE (%) with respect to a low value of the output power $P_{out}$ (dBm) of about 36 dBm when a low value of 3.5 volts is taken for the source voltage Vdd. Further, about 69% is obtained as a maximum of the power-added efficiency PAE with respect to a middle value of the output power $P_{out}$ (dBm) of about 37 dBm when a middle value of 4 volts is taken for the source voltage Vdd. In addition, about 69% is obtained as a maximum of the power-added efficiency PAE with respect to a high value of the output power $P_{out}$ (dBm) of about 39 dBm when a high value of 5 volts is taken for the source voltage Vdd. Incidentally, the gate width Wg of the LDMOS transistor is 49 mm in this case.

FIG. 17 is a plot showing the relation between the output power $P_{out}$ (dBm) and the power-added efficiency PAE (%) when the gate width Wg of the LDMOS transistor is changed to 49, 39, and 28 mm. In regard to the relation, the following are clear. When a small value of 28 mm is taken for the gate width Wg, a high value of not less than 80% is obtained as the maximum power-added efficiency PAE (%) with respect to a low output power $P_{out}$ (dBm) between about 35.8 and 36.6 dBm. When a middle value of 39 mm is taken for the gate width Wg, a relatively high value of about 80% is obtained as the maximum power-added efficiency PAE (%) with respect to a middle output power $P_{out}$ (dBm) between about 36.1 and 36.5 dBm. When a large value of 49 mm is taken for the gate width Wg, a relatively low value of about 75% is obtained as the maximum power-added efficiency PAE (%) with respect to a high output power $P_{out}$ (dBm) of about 36.8 dBm. The gate lengths Lg are all 0.22 nm, which is common to the small-sized device having a small gate width Wg of 28 mm, the middle-sized device having a middle gate width Wg of 39 mm, and the large-sized device having a large gate width Wg of 49 mm.

From the above examination, the following findings were gained technically.

First Finding

In the case where the output power $P_{out}$ of an RF power amplifier is lower, the power-added efficiency PAE is improved by use of an LDMOS transistor having a smaller gate width Wg. In contrast, in the case where the output power $P_{out}$ is higher, the power-added efficiency PAE is improved by use of an LDMOS transistor having a larger gate width Wg. (See FIG. 17)

Second Finding

In the case where the output power $P_{out}$ of an RF power amplifier is higher, the power-added efficiency PAE is improved by use of a higher source voltage Vdd. In contrast, in the case where the output power $P_{out}$ of an RF power amplifier is lower, the power-added efficiency PAE is improved by use of a lower source voltage Vdd. (See FIG. 16)

The invention was made based on the findings which the inventors found from the examination prior to the invention.

Based on the findings, the inventors reached a basic technical idea of the invention including: performing RF power amplification by use of a small-sized amplification device when the output power $P_{out}$ of an RF power amplifier is lower; performing RF power amplification by use of a large-sized amplification device when the output power $P_{out}$ of the RF power amplifier is higher; and executing the switching of the role sharing rate in RF power amplification between the small-sized amplification device and the large-sized amplification device in accordance with the difference of the input bias voltages of the two amplification devices and the change in amplitude of an RF input signal which is input from an output of an RF drive-and-amplification circuit located in the preceding stage. An idea similar to a technical idea stated in a latter half portion hereof has been known for a Doherty type RF power amplifier. However, a Doherty type RF power amplifier incorporates two identical devices as described in Nonpatent Document 3, which lacks first half and middle portions of the basic technical idea of the invention.

Further, the inventors reached a more specific technical idea based on the second finding for the purpose of improving the power-added efficiency. Such idea includes: controlling the source voltage of an output electrode of the small-sized amplification device to a lower value when the output power $P_{out}$ of an RF power amplifier is low; and controlling the source voltage of an output electrode of the large-sized amplification device to a higher value when the output power $P_{out}$ of the RF power amplifier is high.

Therefore, it is an object of the invention to provide a high-frequency power amplifier which can show a high power-added efficiency characteristic, whether it works with a low output power or a high output power.

It is another object of the invention to provide a multimode-capable RF power amplifier, in which the variation in output power owing to the variation in load on an amplifier in linear amplification is reduced.

The above and other objects and novel features of the invention will be apparent from descriptions hereof and the accompanying drawings.

Now, the representatives of forms in association with the aspects of the invention will be outlined below.

[1] An RF power amplifier in accordance with a form of the invention includes a first amplification device (Q1) and a second amplification device (Q2) as final-stage amplification power devices connected in parallel between an input terminal (RF_In) and an output terminal (RF_Out). The first amplification device (Q1) and the second amplification device (Q2) are formed on a common semiconductor chip (Chip1) A first bias voltage (Vg1) of an input terminal of the first amplification device (Q1) is set to be higher than a second bias voltage (Vg2) of an input terminal of the second amplification device (Q2) so that the first amplification device (Q1) is operational in any one of operating classes between Class B with a conduction angle of π (180°) and Class AB with a conduction angle of π (180°) to 2π (360°), and the second amplification device (Q2) is operational in Class C with a conduction angle below π (180°). A first effective device size (Wgq1) of the first amplification device (Q1) is intentionally set to be smaller than a second effective device size (Wgq2) of the second amplification device (Q2) beyond a range of a manufacturing error of the semiconductor chip (see FIG. 1).

With means in accordance with the form of the invention, the originally intended objects can be achieved by the following operations. In the time of low output power, the amplitude level of an RF input power signal of the input terminal (RF_In) is in Low state, and therefore the second amplification device (Q2) supplied with a low second bias voltage (Vg2) remains deactivated. In contrast, the first amplification device (Q1) supplied with a high first bias voltage (Vg1) amplifies an RF input power signal of the input terminal (RF_In). In this time, as the first effective device size (Wgq1) of the first amplification device (Q1) is small, the power-added efficiency PAE (%) with respect to a low output power $P_{out}$ (dBm) can be improved. In the time of a high output power, as the amplitude level of an RF input power signal at the input terminal (RF_In) rises, not only the first amplification device (Q1) but also the second amplification device (Q2) amplify the RF input power signal from the input terminal (RF_In). In this time, as the first effective device size (Wgq2) of the second amplification device (Q2) is large, the power-added efficiency (PAE) with respect to a high output power (RF_Out) can be improved (see FIG. 2).

In an RF power amplifier in accordance with a specific form of the invention, a first source voltage (Vdd1) is supplied to an output electrode of the first amplification device (Q1) through a first load device (Ldd1), a second source voltage (Vdd2) is supplied to an output electrode of the second amplification device (Q2) through a second load device (Ldd2), and a power supply circuit (PW_Sply) works so that a level of the first source voltage (Vdd1) reduces in response to a reduction in level of an output power (RF_Out) of the RF power amplifier (see FIG. 1).

With means in accordance with the specific form of the invention, when the level of an output power (RF_Out) of the RF power amplifier is low, the level of the first source voltage (Vdd1) supplied to an output electrode of the first amplification device (Q1) reduces. Therefore, as described in SECOND FINDING, when the output power of the RF power amplifier is low, the power-added efficiency PAE is improved by use of a low source voltage (Vdd).

In an RF power amplifier in accordance with a specific form of the invention, a first source voltage (Vdd1) is supplied to an output electrode of the first amplification device (Q1) through a first load device (Ldd1), a second source voltage (Vdd2) is supplied to an output electrode of the second amplification device (Q2) through a second load device (Ldd2), and a power supply circuit (PW_Sply) works so that a level of the second source voltage (Vdd2) rises in response to a rise in level of an output power (RF_Out) of the RF power amplifier (see FIG. 1).

With means in accordance with the specific form of the invention, when the level of an output power (RF_Out) of the RF power amplifier is high, the level of the second source voltage (Vdd2) supplied to an output electrode of the second amplification device (Q2) rises. Therefore, as described in SECOND FINDING, when the output power of the RF power amplifier is high, the power-added efficiency PAE is improved by use of a high source voltage (Vdd).

In an RF power amplifier in accordance with a specific form of the invention, a ¼-wavelength output line (Out_Tr_Ln) is connected between the output terminal (RF_Out) and an output electrode of the first amplification device (Q1), and a ¼-wavelength input line (In_Tr_Ln) is connected between an input electrode of the second amplification device (Q2) and the input terminal (RF_In), whereby the first and second amplification devices (Q1, Q2) work in accordance with Doherty system (see FIG. 6).

An RF power amplifier in accordance with a specific form of the invention further includes RF drive-and-amplification stages (1st_Amp, 2nd_Amp) for driving the final-stage amplification power devices (Q1, Q2). In the RF power amplifier, the power supply circuit (DC-DC_Conv, DBC1, DBC2) is supplied with an external source voltage (Vdd), and supplies the first and second amplification devices (Q1, Q2) with a first source voltage (Vdd1) and a second source voltage (Vdd2) controlled in response to a level of a transmission level-specifying signal (Vramp) respectively (see FIG. 8).

In an RF power amplifier in accordance with a specific form of the invention, the first source voltage (Vdd1) is supplied to the output electrode of the first amplification device (Q1) through the first load device (Ldd1), the second source voltage (Vdd2) is supplied to an output electrode of the second amplification device (Q2) through the second load device (Ldd2), and the power supply circuit (DC-DC_Conv, DBC1, DBC2) works so that the level of the first source voltage (Vdd1) reduces in response to reduction in level of the output power (RF_Out) of the RF power amplifier (see FIG. 10).

In an RF power amplifier in accordance with a specific form of the invention, the first source voltage (Vdd1) is supplied to the output electrode of the first amplification device (Q1) through the first load device (Ldd1), the second source voltage (Vdd2) is supplied to the output electrode of the second amplification device (Q2) through the second load device (Ldd2), the power supply circuit (DC-DC_Conv, DBC1, DBC2) works so that the level of the second source voltage (Vdd2) rises in response to rise in the level of the output power (RF_Out) of the RF power amplifier (see FIG. 10).

In an RF power amplifier in accordance with a specific form of the invention, the power supply circuit (DC-DC_Conv, DBC1, DBC2) includes a DC-DC converter (DC-DC_Conv) composed of a switching regulator (see FIG. 9).

An RF power amplifier in accordance with a specific form of the invention includes: a power detector (PW_Det) for detecting a level in connection with the output power (PF_Out) from the output terminal (RF_Out); an error amplifier (Err_Amp) for producing an automatic power control signal (Vapc) when being supplied with the transmission level-specifying signal (Vramp) and a power detection signal (Vdet) of the power detector (PW_Det); driving input bias circuits (1stGBC, 2ndGBC) for controlling the level of driving input bias voltages (1stVgb, 2ndVgb) of the RF drive-and-amplification stages (1st_Amp, 2nd_Amp) in response to the automatic power control signal (Vapc) produced by the error amplifier (Err_Amp); and final-stage input bias circuits (GBC1, GBC2) for controlling the levels of final-stage input bias voltages (3rd_1Vgb, 3rd_2Vgb) of the first and second amplification devices (Q1, Q2) as the final-stage amplification power devices (Q1, Q2) in response to the automatic power control signal (Vapc) produced by the error amplifier (Err_Amp) (see 8).

In an RF power amplifier in accordance with a specific form of the invention, the first amplification device (Q1) and second amplification device (Q2) are each a field effect transistor (see FIG. 1).

In an RF power amplifier in accordance with a specific form of the invention, the field effect transistor is an LDMOS.

In an RF power amplifier in accordance with a specific form of the invention, the first amplification device (Q1) and second amplification device (Q2) are each a bipolar transistor (see FIG. 7).

Further, in an RF power amplifier in accordance with a specific form of the invention, the bipolar transistor is of a heterojunction type.

In an RF power amplifier in accordance with a specific form of the invention, the first effective device size (Wgq1) of the first amplification device (Q1) is set to be substantially half of the second effective device size (Wgq2) of the second amplification device (Q2) (see FIG. 1).

In an RF power amplifier in accordance with a specific form of the invention, the semiconductor chip (CHIP_L) with the first and second amplification devices (Q1, Q2) formed thereon, the power detector and the error amplifier (PW_Det&Err_Amp), and the DC-DC converter (DC-DC_Conv) are incorporated in an RF power module package (100) (FIG. 14).

An RF power amplifier in accordance with a specific form of the invention includes: a first amplification device (Q1A), a second amplification device (Q2), and a third amplification device (Q1B) as final-stage amplification power devices connected in parallel between an input terminal (RF_In) and an output terminal (RF_Out). The first to third amplification devices (Q1A, Q2, Q1B) are formed on a common semiconductor chip (Chip1). An input electrode of the third amplification device (Q1B) is connected to an input electrode of the first amplification device (Q1A) through a switching device (MEMS_SW).

When the RF power output ($P_{out}$) is at Low level, the switching device (MEMS_SW) is controlled to be in OFF state, and thus the third amplification device (Q1B) is controlled to be in OFF state.

When the RF power output (Pout) is at Low level, a first bias voltage (Vg1) of an input terminal of the first amplification device (Q1A) is set to be higher than a second bias voltage (Vg2) of an input terminal of the second amplification device (Q2) so that the first amplification device (Q1A) is operational in any one of operating classes between Class B with a conduction angle of π (180°) and Class AB with a conduction angle of π (180°) to 2π (360°), and the second amplification device (Q2) is operational in Class C with a conduction angle below π (180°).

When the RF power output (Pout) is at High level, the switching device (MEMS_SW) is controlled to be in ON state.

When the RF power output (Pout) is at High level, a first bias voltage (Vg1) of an input terminal of the first amplification device (Q1A) and an input terminal of the third amplification device (Q1B), and the second bias voltage (Vg2) of the input terminal of the second amplification device (Q2) are set so that the first and third amplification devices (Q1A, Q1B) are operational in any one of operating classes between Class B with a conduction angle of π (180°) and Class AB with a conduction angle of π (180°) to 2π (360°), and the second amplification device (Q2) is also operational in any one of operating classes between Class B with a conduction angle of π (180°) and Class AB with a conduction angle of π (180°) to 2π (360°).

A first effective device size (Wgq1A) of the first amplification device (Q1A) and a third effective device size (Qgq1B) of the third amplification device (Q1B) are set to be substantially identical to each other, but intentionally smaller than a second effective device size (Wgq2) of the second amplification device (Q2) beyond a range of a manufacturing error of the semiconductor chip (see FIG. 12).

With means in accordance with the specific form of the invention, when the RF power output (Pout) is at High level, the first amplification device (Q1A) and third amplification device (Q1B), whose input terminals are connected together by the switching device (MEMS_SW), work in any one of operating classes between Class B and Class AB, and the second amplification device (Q2) also works in any one of operating classes between Class B and AB. As a result, a high level RF power output (Pout) can be achieved as the RF power amplifier makes a DD-CIMA type power amplifier.

An RF power amplifier in accordance with a specific form of the invention includes: RF drive-and-amplification stages (1st_Amp, 2nd_Amp) for driving the final-stage amplification power devices (Q1A, Q1B, Q1); and a power supply circuit (DC-DC_Conv, DBC1, DBC2) which is supplied with an external source voltage (Vdd), and which supplies a first source voltage (Vdd1) controlled in response to a level of a transmission level-specifying signal (Vramp) to the first and third amplification devices (Q1A, Q1B), and supplies a controlled second source voltage (Vdd2) to the second amplification device (Q2) (see FIG. 12).

In an RF power amplifier in accordance with a specific form of the invention, the first source voltage (Vdd1) is supplied to an output electrode of the first amplification device (Q1A) and an output electrode of the third amplification device (Q1B) through a first load device (Ldd1), the second source voltage (Vdd2) is supplied to an output electrode of the second amplification device (Q2) through a second load device (Ldd2), and the power supply circuit (DC-DC_Conv, DBC1, DBC2) works so that a level of the first source voltage (Vdd1) reduces in response to reduction in level of an output power (FR_Out) of the RF power amplifier (see FIG. 13).

In an RF power amplifier in accordance with a specific form of the invention, the first source voltage (Vdd1) is supplied to an output electrode of the first amplification device (Q1A) and an output electrode of the third amplification device (Q1B) through a first load device (Ldd1), the second source voltage (Vdd2) is supplied to an output electrode of the second amplification device (Q2) through a second load device (Ldd2), and the power supply circuit (DC-DC_Conv, DBC1, DBC2) works so that a level of the second source voltage (Vdd2) rises in response to rise of an output power (RF_Out) of the RF power amplifier (see FIG. 13).

In an RF power amplifier in accordance with a specific form of the invention, the power supply circuit (DC-DC-conv, DBC1, DBC2) includes a DC-DC converter (DC-DC-Conv) composed of a switching regulator (see FIG. 9).

An RF power amplifier in accordance with a specific form of the invention further includes: a power detector (PW_Det) for detecting a level in connection with the output power (RF_Out) from the output terminal (RF_Out); an error amplifier (Err_Amp) for producing an automatic power control signal (Vapc) when being supplied with the transmission level-specifying signal (Vramp) and a power detection signal (Vdet) of the power detector (PW_Det); driving input bias circuits (1stGBC, 2ndGBC) for controlling the level of driving input bias voltages (1stVgb, 2ndVgb) of the RF drive-and-amplification stages (1st_Amp, 2nd_Amp) in response to the automatic power control signal produced by the error amplifier (Err_Amp); and final-stage input bias circuits (GBC1, GBC2) for controlling the levels of final-stage input bias voltages (3rd_1Vgb, 3rd_2Vgb) of the first to third amplification devices (Q1A, Q2, Q1B) as the final-stage amplification power devices (Q1, Q2) in response to the automatic power control signal (Vapc) produced by the error amplifier (Err_Amp) (see FIG. 12).

In an RF power amplifier in accordance with a specific form of the invention the switching device (MEMS_SW) is a MEMS switch formed on a semiconductor chip (see FIG. 12).

In an RF power amplifier in accordance with a specific form of the invention, the first amplification device (Q1A), second amplification device (Q2) and third amplification device (Q1B) are each a field effect transistor (see FIG. 12).

In an RF power amplifier in accordance with a specific form of the invention, the field effect transistor is an LDMOS.

In an RF power amplifier in accordance with a specific form of the invention, the first amplification device (Q1A), the second amplification device (Q2) and the third amplification device (Q1B) are each a bipolar transistor.

Further, in an RF power amplifier in accordance with a specific form of the invention, the bipolar transistor is of a heterojunction type.

In an RF power amplifier in accordance with a specific form of the invention, the first effective device size (Wgq1A) of the first amplification device (Q1A) and the third effective device size (Wgq1B) of the third amplification device (Q1B) are set to be substantially half of the second effective device size (Wgq2) of the second amplification device (Q2) (see FIG. 12).

In an RF power amplifier in accordance with a specific form of the invention, the semiconductor chip (CHIP_L) with the first to third amplification devices (Q1A, Q2, Q1B) formed thereon, the power detector and the error amplifier (PW_Det&Err_Amp), and the DC-DC converter (DC-DC_Conv) are incorporated in an RF power module package (100) (see FIG. 14).

[2] A high-frequency power amplifier in accordance with a form of the invention supporting a multimode includes: two power amplifiers disposed in parallel, and a bias control circuit for individually controlling biases of the power amplifiers depending on the method of modulating an input signal. For example, when the high-frequency power amplifier is made to work in the linear amplification mode (e.g. a signal modulated in accordance with CDMA, WCDMA, etc.), the biases of the two power amplifiers disposed in parallel are set so that the biases are equal and the power amplifiers are operational in any one of Classes A to B (the two power amplifiers are identical in their characteristics, but sometimes biases do not agree with each other because there are slight differences in characteristics between the amplifiers actually).

In the case where the input signal (e.g. GSM-modulated signal) causes the high-frequency power amplifier to operate in the nonlinear amplification mode, one of the two power amplifiers disposed in parallel is changed in bias and set so as to be operational in Class B to C for the purpose of increasing the efficiency of the high-frequency power amplifier including two power amplifiers on the whole. As a result, a high-frequency power amplifier in which an increased efficiency can achieved even with the output power at or below Middle level can be realized. Even in other modulation methods other than that described here, the high-frequency power amplifier can be accommodated by providing each amplifier with biasing conditions optimal for such modulation methods. Three or more power amplifiers arranged in parallel may be used.

In addition, when the bias control circuit is controlled so that the bias is changed continuously following an average input power, rapid changes of power gain, current variations and the like do not occur and there is no fear of substantially affecting a portable terminal control system and a whole system. Therefore, a high-frequency power amplifier in which an increased efficiency can achieved even with the output power at or below Middle level can be realized.

DETAILED DESCRIPTION OF THE PREFERRED EMBODIMENTS

Configuration of RF Power Amplifier

Figure 1:
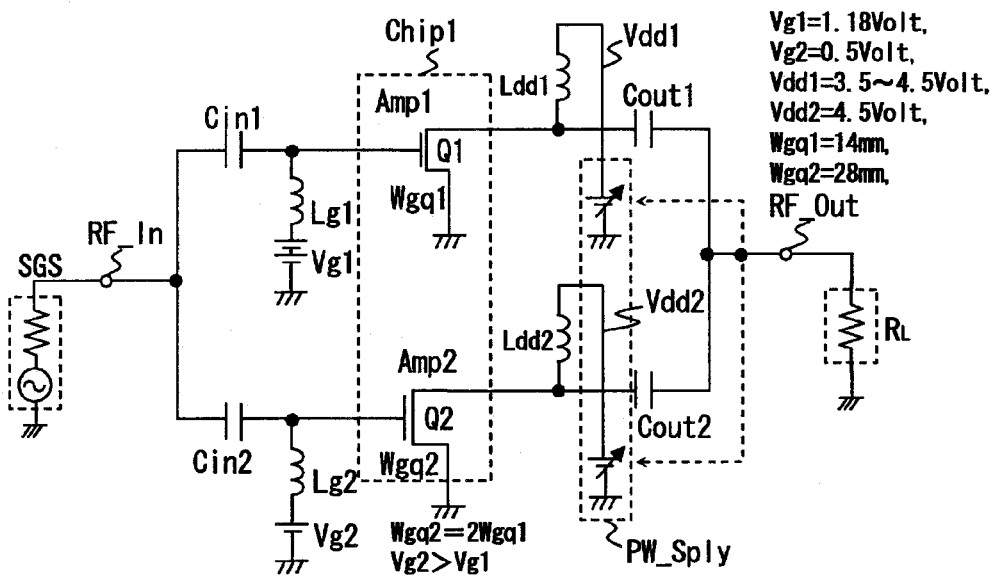
FIG. 1 is a circuit diagram showing an RF power amplifier in accordance with an embodiment of the invention, which is incorporated in a portable phone operable to communicate with a base station.

FIG. 1 is a circuit diagram showing an RF power amplifier in accordance with an embodiment of the invention, which is incorporated in a portable phone operable to communicate with a base station.

As shown in the drawing, the RF power amplifier is configured as an RF power module incorporated in one package.

An RF transmission signal from an RF transmitter-receiver analog signal processing integrated circuit (hereinafter abbreviated to RF IC) incorporated in a communication terminal tool such as a portable phone terminal is amplified by an RF drive-and-amplification stage (not shown). An RF input signal RF_In output from an output terminal of the RF drive-and-amplification stage is supplied through a first input capacitor Cin1 and a second input capacitor Cin2 to a gate input terminal of a first amplification device Q1 and a gate input terminal of a second amplification device Q2 respectively. The gate input terminal of the first amplification device Q1 is supplied with a first input bias voltage Vg1 through an inductor Lg1 for supplying a first input bias voltage. The gate input terminal of the second amplification device Q2 is supplied with a second input bias voltage Vg2 through an inductor Lg2 for supplying a second input bias voltage. The first input bias voltage Vg1 is set to be higher than the second input bias voltage Vg2 so that the first amplification device Q1 works in any one of Class A and Class AB and the second amplification device Q2 works in Class C. The first amplification device Q1 and the second amplification device Q2 are N-channel LDMOS transistors which are formed on a common semiconductor chip Chip1 concurrently. The first amplification device Q1 and the second amplification device Q2 may be GaAs-based or SiGe-based hetero bipolar transistors which are formed on a common semiconductor chip concurrently. Also, it is possible to form the first input capacitor Cin1 and the second input capacitor Cin2, and the inductor Lg1 for supplying a first input bias voltage and the inductor Lg2 for supplying a second input bias voltage on the same semiconductor chip on which the first amplification device Q1 and the second amplification device Q2 are formed.

As known well, under the condition where an input signal of a sinusoidal waveform is supplied, a power amplifier having a conduction angle γ, as an amplification power device, which satisfies γ=2π (360°) is classified as a power amplifier of an operating class of A; a power amplifier having a conduction angle γ, which satisfies π (180°)<γ<2π (360°) is classified as a power amplifier of an operating class of AB; a power amplifier having a conduction angle γ, which satisfies γ=π (180°) is classified as a power amplifier of an operating class of B; and a power amplifier having a conduction angle γ, which satisfies γ<π (180°) is classified as a power amplifier of an operating class of C.

For example, the first input bias voltage Vg1 is set to 1.18 volts, and the second input bias voltage Vg2 is set to 0.5 volts. The gate threshold voltages VthN of the first and second amplification devices Q1 and Q2 are both 0.8 volts. Therefore, the first amplification device Q1 works in Class AB, and the second amplification device Q2 works in Class C. The first amplification device Q1 has a drain output terminal, to which a first source voltage Vdd1 is supplied from a power supply circuit PW_Sply through a first load inductor Ldd1. The second amplification device Q2 has a drain output terminal, to which a second source voltage Vdd2 is supplied from the power supply circuit PW_Sply through a second load inductor Ldd2. The power supply circuit PW_Sply reduces the level of the first source voltage Vdd1 in response to reduction of the level of an output power RF_Out of the RF power amplifier, and raises the level of the first source voltage Vdd1 in response to raise of the level of output power RF_Out. For example, the first source voltage Vdd1 is lowered to 3.5 volts when the output power RF_Out of the RF power amplifier is at Low level, whereas the first source voltage Vdd1 is raised to 4.5 volts when the output power RF_Out of the RF power amplifier is at High level. In contrast, even when the output power RF_Out of the RF power amplifier is changed from Low level to High level, the level of the second source voltage Vdd2 is kept at a substantially constant voltage of 4.5 volts. However, the level of the second source voltage Vdd2 may be raised in response to raise of the level of the output power RF_Out.

Meanwhile, the first amplification device Q1 and the second amplification device Q2 are formed on a common semiconductor chip through the same manufacturing process. The gate width of the first amplification device Q1 as a first effective device size Wgq1 is set to 14 mm; the gate width of the second amplification device Q2 as a second effective device size Wgq2 is set to 28 mm. The first effective device size Wgq1 of the first amplification device Q1 is substantially half of the second effective device size Wgq2 of the second amplification device Q2, which is set to be smaller beyond a range of the manufacturing error of the semiconductor chip. However, except the first and second effective device sizes Wgq1 and Wgq2, the other parameters are set to be common to the first and second amplification devices Q1 and Q2. In other words, the first and second amplification devices Q1 and Q2 are substantially identical to each other in gate isolation film thickness Tox, gate length Lg, and channel impurity density Nd, and of the parameters, the gate length Lg is 0.22 nm.

While input and output microstrip lines are not shown in FIG. 1, the branch-type input microstrip lines are connected between the RF input terminal RF_In and one end of the first input capacitor Cin1, and between the RF input terminal RF_In and one end of the second input capacitor Cin2; the combined-type output microstrip lines are connected between the other end of the first output capacitor Cout1 and the RF output signal terminal RF_Out, and between the other end of the second output capacitor Cout2 and the RF output signal terminal RF_Out. The input and output microstrip lines have given characteristic impedances so as to make their line lengths millimeter order or shorter.

As described above, as the first effective device size Wgq1 of the first amplification device Q1 is set to be substantially half of the second effective device size Wgq2 of the second amplification device Q2, the RF output power $P_{out}$ at which the maximum power-added efficiency PAE can be gained varies between the first and second amplification devices Q1 and Q2.

Figure 2:
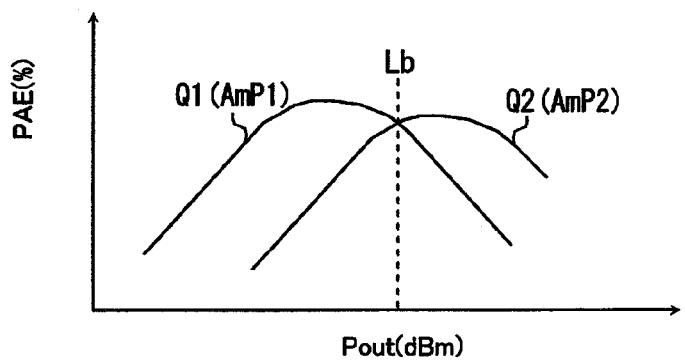
FIG. 2 is a plot showing RF output power vs. power-added efficiency curves of the first and second amplification devices Q1 and Q2 of the RF power amplifier shown in FIG. 1.

FIG. 2 is a plot showing RF output power $P_{out}$ (dBm) vs. power-added efficiency PAE (%) curves of the first and second amplification devices Q1 and Q2 of the RF power amplifier shown in FIG. 1.

As shown in FIG. 2, in a low output state where the RF output power $P_{out}$ (dBm) is below a line Lb, the first amplification device Q1 shows a higher maximum power-added efficiency PAE, the first effective device size Wgq1 of which is set to 14 mm. In the low output state, the amplitude level of the RF input signal RF_In from the output terminal of the RF drive-and-amplification stage (not shown in FIG. 1) is relatively low. Therefore, only the first amplification device Q1 of the operating class AB works, and the second amplification device Q2 of the operating class C stays in a nearly cutoff state substantially. Thus, in the low output state, only the first amplification device Q1 functions, which is set to have a smaller first effective device size Wgq1 and develops the higher power-added efficiency PAE in the low output state. However, in a high output state where the RF output power $P_{out}$ (dBm) is above the line Lb, the second amplification device Q2 shows a higher power-added efficiency PAE, the second effective device size Wgq2 of which is set to a larger value of 28 mm. In the low output state, the amplitude level of the RF input signal RF_In from the output terminal of the RF drive-and-amplification stage (not shown in FIG. 1) is relatively high. As a result, in addition to the first amplification device Q1 of the operating class AB working, the second amplification device Q2 of the operating class C starts its amplitude operation. Thus, in the high output state, the second amplification device Q2 performs the amplitude operation, which is set to have a larger second effective device size Wgq2 and develops the higher power-added efficiency PAE in the high output state. In this situation, the first source voltage Vdd1 supplied to the drain of the first amplification device Q1 set to have a smaller first effective device size Wgq1 is raised from 4.0 to 4.5 volts. As a result, the first amplification device Q1 can develop a relatively high maximum power-added efficiency PAE in the high output state.

Figure 3:
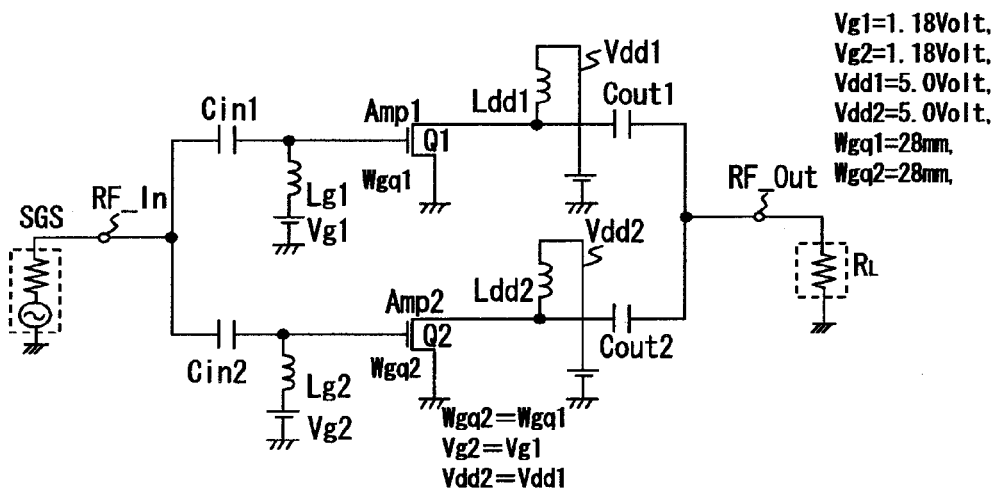
FIG. 3 is a circuit diagram showing an RF power amplifier for reference in making a comparison with the RF power amplifier shown in FIG. 1 in characteristics.

FIG. 3 is a circuit diagram showing an RF power amplifier for reference in making a comparison with the RF power amplifier shown in FIG. 1 in characteristics.

The circuit connection shown in the drawing are the same as that shown in FIG. 1. However, in the case shown in FIG. 3, the first effective device size Wgq1 of the first amplification device Q1 and the second effective device size Wgq2 of the second amplification device Q2 are set to a common gate width of 28 mm. Therefore, even when the RF output power $P_{out}$ (dBm) is changed from the low output state to the high output state, the first and second input bias voltages Vg1 and Vg2 are kept at a common value of 1.18 volts, and the first and second source voltages Vdd1 and Vdd2 are kept at a common value of 5.0 volts. Hence, even when the RF output power $P_{out}$ (dBm) is changed from the low output state to the high output state, both the first and second amplification devices Q1 and Q2 work in Class AB. Therefore, it can be said that the RF power amplifier shown in FIG. 3 is a DD-CIMA type RF power amplifier.

Figure 4:
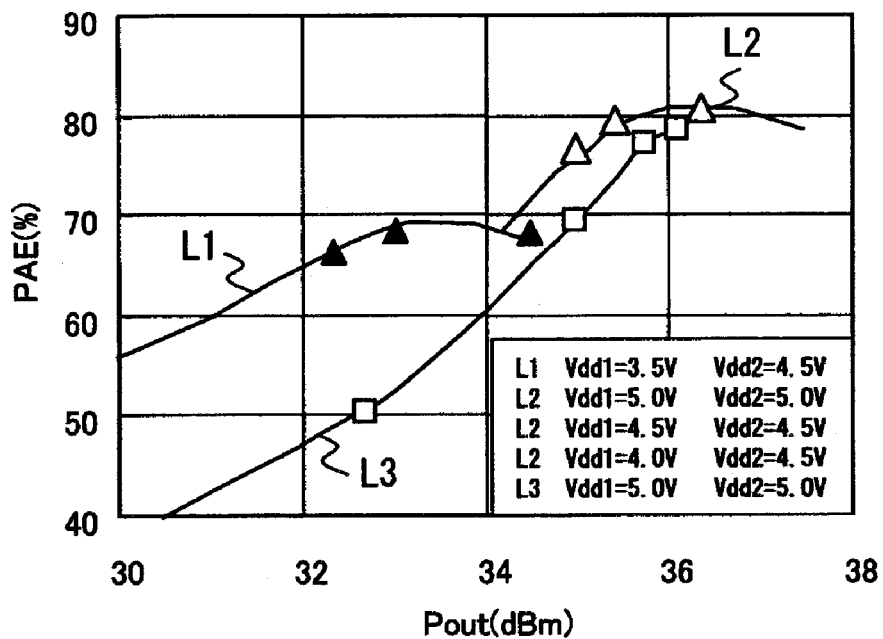
FIG. 4 is a plot showing RF output power vs. power-added efficiency curves of the RF power amplifier in accordance with the embodiment of the invention shown in FIG. 1 and the reference RF power amplifier shown in FIG. 3.

FIG. 4 is a plot showing RF output power $P_{out}$ (dBm) vs. power-added efficiency PAE (%) curves of the RF power amplifier in accordance with the embodiment of the invention shown in FIG. 1 and the reference RF power amplifier shown in FIG. 3.

In the drawing, the curve L3 shows an RF output power $P_{out}$ (dBm) vs. power-added efficiency PAE (%) curve of the reference RF power amplifier shown in FIG. 3, and the curves L1 and L2 show the characteristics of the RF power amplifier shown in FIG. 1 in the low output state and the high output state respectively. It can be understood from the drawing that the power-added efficiency PAE (%) of the RF power amplifier shown in FIG. 1 in the low output state, which is indicated by the curve L1 is much higher than the power-added efficiency PAE (%) of the RF power amplifier shown in FIG. 3 in the low output state, which is indicated by the curve L3. Also, it can be seen that the power-added efficiency PAE (%) of the RF power amplifier shown in the high output state in FIG. 1, which is indicated by the curve L2, is higher than that in the high output state of the RF power amplifier shown in FIG. 3, which is indicated by the curve L3.

The curve L1 is a result of sweeping of the RF input power $P_{in}$ from 0 to 23 dBm under the condition where the first and second source voltages Vdd1 and Vdd2 are 3.5 and 4.5 volts respectively. The curve L2 shows the characteristic when the first and second source voltages Vdd1 and Vdd2 are changed in ascending order of the output power $P_{out}$ under the condition where the RF input power $P_{in}$ is 23 dBm; the order is a first condition (Vdd1=4 volts, and Vdd2=4.5 volts), a second condition (Vdd1=4.5 volts, and Vdd2=4.5 volts), and a third condition (Vdd1=5 volts, and Vdd2=5 volts).

Figure 5:
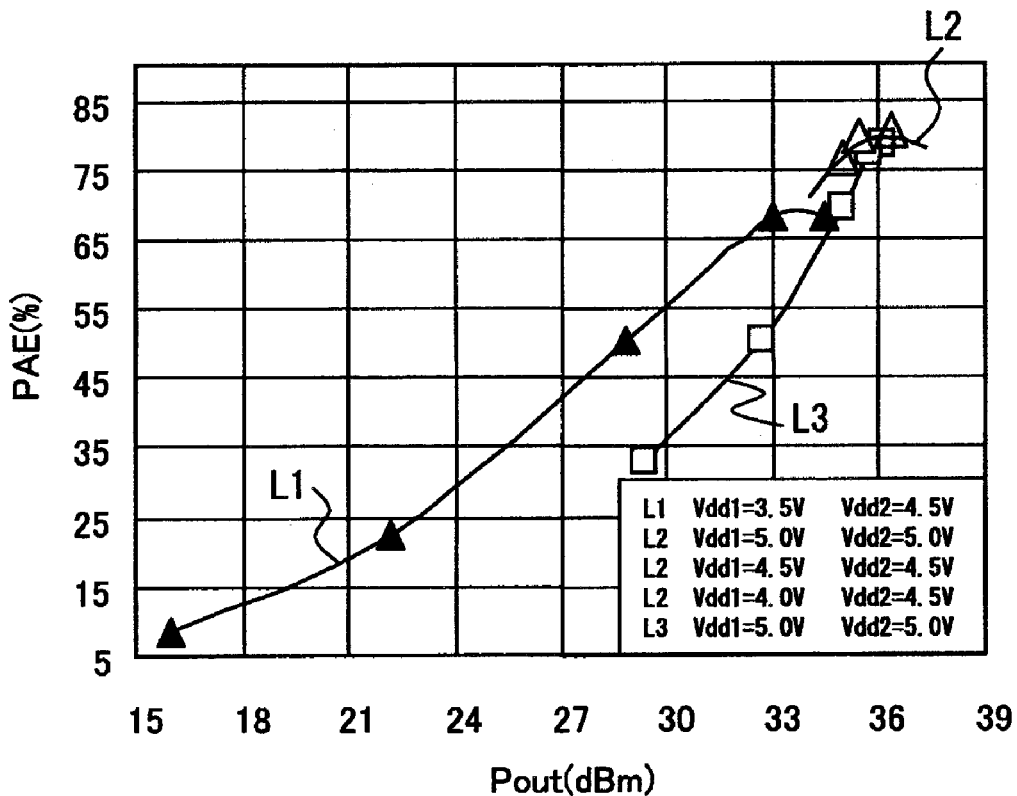
FIG. 5 is a plot showing RF output power vs. power-added efficiency curves of the RF power amplifier in accordance with the embodiment of the invention shown in FIG. 1 and the reference RF power amplifier shown in FIG. 3.

Like FIG. 4, FIG. 5 is a plot showing RF output power $P_{out}$ (dBm) vs. power-added efficiency PAE (%) curves of the RF power amplifier in accordance with the embodiment of the invention shown in FIG. 1 and the reference RF power amplifier shown in FIG. 3. The case shown in FIG. 5 differs from the case shown in FIG. 4 in that measurements were made from a low RF output power $P_{out}$ of 15 dBm. As in the case of FIG. 4, in the case of FIG. 5 the curve L1 is a result of sweeping of the RF input power $P_{in}$ from 0 to 23 dBm under the condition where the first and second source voltages Vdd1 and Vdd2 are 3.5 and 4.5 volts respectively. The curve L2 shows the characteristic when the first and second source voltages Vdd1 and Vdd2 are changed in ascending order of the output power $P_{out}$ under the condition where the RF input power $P_{in}$ is 23 dBm; the order is a first condition (Vdd1=4 volts, and Vdd2=4.5 volts), a second condition (Vdd1=4.5 volts, and Vdd2=4.5 volts), and a third condition (Vdd1=5 volts, and Vdd2=5 volts).

It has been confirmed in the measurements shown in FIG. 5 that when the RF power amplifier shown in FIG. 1 outputs an RF output power $P_{out}$ of 15 dBm, the peak value of the driving input voltage of the gate of the second amplification device Q2 is smaller than 0.8 volts, which is a gate threshold voltage VthN of the second amplification device Q2. The fact implies that when the RF power amplifier shown in FIG. 1 outputs an RF output power $P_{out}$ of 15 dBm, only the first amplification device Q1 of the operating class AB works, and the second amplification device Q2 of the operating class C has not performed any operation of Class C. Further, it has been confirmed in measurements in the case shown in FIG. 5 that when the RF power amplifier shown in FIG. 1 outputs an RF output power $P_{out}$ of 22 dBm, the peak value of the driving input voltage of the gate of the second amplification device Q2 slightly exceeds 0.8 volts, which is the gate threshold voltage VthN of the second amplification device Q2. The fact implies that when the RF power amplifier shown in FIG. 1 outputs an RF output power $P_{out}$ of 22 dBm, not only the first amplification device Q1 of the operating class AB works but also the second amplification device Q2 of the operating class C starts a class-C operation.

Other Embodiments

Figure 6:
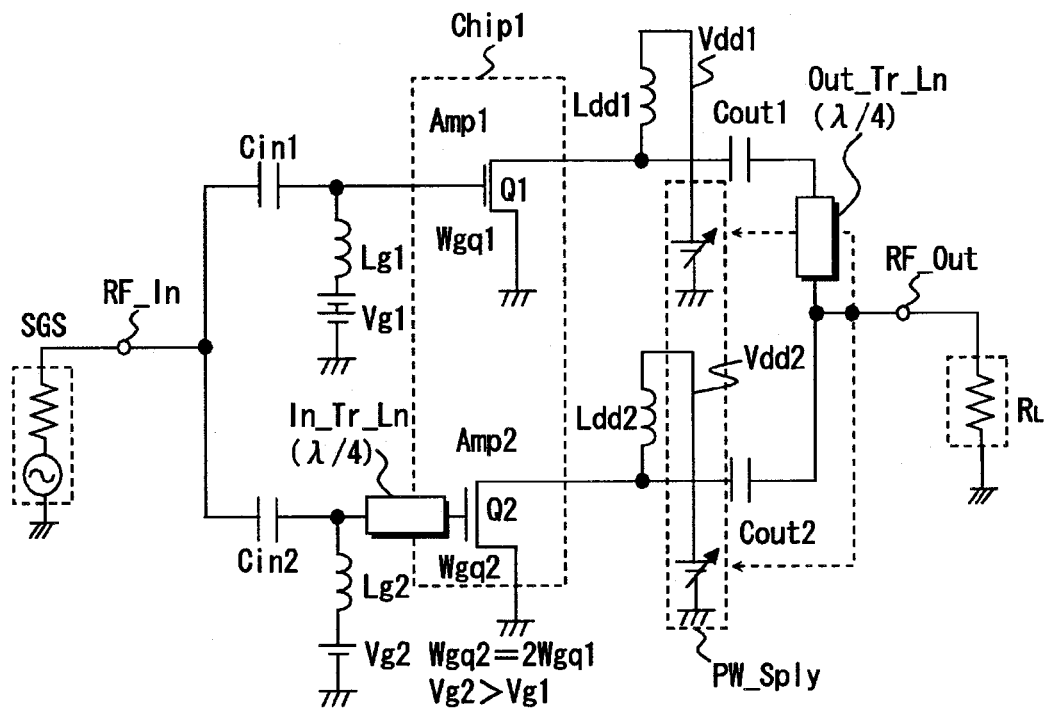
FIG. 6 is a circuit diagram showing an RF power amplifier in accordance with another embodiment of the invention, which is used in a base station and outputs an RF output signal with a larger power.

FIG. 6 is a circuit diagram showing an RF power amplifier in accordance with another embodiment of the invention, which is used in a base station and outputs an RF output signal with a larger power. The RF power amplifier shown in FIG. 6 is identical to that shown in FIG. 1 except that a ¼-wavelength output line Out_Tr_Ln is connected between the output terminal RF_Out and the drain output electrode of the first amplification device Q1, and a ¼-wavelength input line In_Tr_Ln is connected between the gate input electrode of the second amplification device Q2 and the input terminal RF_In. Therefore, the first and second amplification devices Q1 and Q2 work in accordance with Doherty system. Operations of the RF power amplifier of Doherty type will be described below.

In the case where an output current $I'_1$ of a first final stage amplifier Amp1 composed of the first amplification device Q1, and an output current $I_2$ of a second final stage amplifier Amp2 composed of the second amplification device Q2 flow into the a load $R_L$, the effective impedance $Z'_1$ of the load $R_L$ when the load $R_L$ is viewed from the output of the ¼-wavelength output line Out_Tr_Ln and the load impedance $Z_2$ of the load $R_L$ when the load $R_L$ is viewed from the output of the second final stage amplifier Amp2 are given by:

$$Z'_1 = V_0/I'_1 = R_L((I'_1+I_2)/I'_1) = R_L(1+\alpha) \qquad \text{[Expression 2]}$$

$$Z_2 = V_0/I_2 = R_L((I_2+I'_1)/I_2) = R_L(1+1/\alpha) \qquad \text{[Expression 3]}$$

where the impedance of the ¼-wavelength output line Out_Tr_Ln is represented by $Z_T$, and the voltage of the load $R_L$ is represented by $V_0$.

The product of the effective impedance $Z_1$ of the load $R_L$ when the load $R_L$ is viewed from an input of the ¼-wavelength output line Out_Tr_Ln, and the effective impedance $Z'_1$ of the load $R_L$ when the load $R_L$ is viewed from the output of the ¼-wavelength output line Out_Tr_Ln becomes equal to the square of the impedance $Z_T$ of the ¼-wavelength output line Out_Tr_Ln. Hence, the following expressions hold:

$$Z_1 = Z_T^2/Z'_1 = Z_T^2/R_L(1+I_2/I'_1) = Z_T^2/R_L(1+\alpha) \quad \text{[Expression 4]}$$

$$\alpha = I_2/I'_1 = Z'_1/Z_2 \quad \text{[Expression 5]}$$

In the case where the second final stage amplifier Amp2 biased at Class C when the signal amplitude of the RF input signal RF_In is at Low level is in OFF, namely α=0, the effective impedance $Z'_1$, and the load impedances $Z_2$ and $Z_1$ are given by:

$$Z'_{1,\alpha=0} = R_L, Z_{2,\alpha=0} = \infty, Z_{1,\alpha=0} = Z_T^2/R_L \quad \text{[Expression 6]}$$

In the case where the second final stage amplifier Amp2 biased at Class C when the signal amplitude of the RF input signal RF_In is at High level is in ON absolutely, namely α=1, the effective impedance $Z'_1$ and the load impedances $Z_2$ and $Z_1$ are given by:

$$Z'_{1,\alpha=1} = 2R_L, Z_{2,\alpha=1} = 2R_L, Z_{1,\alpha=1} = Z_T^2/2R_L \quad \text{[Expression 7]}$$

It can be seen from Expressions 6 and 7, that the load impedance $Z_1$ of the first final stage amplifier Amp1 and the load impedance $Z_2$ of the second final stage amplifier Amp2 are modulated. If $Z_T = 2R_L$, the load impedance $Z_1$ of the first final stage amplifier Amp1 is $4R_L$ when α=0, and the load impedance $Z_1$ of the first final stage amplifier Amp1 and the load impedance $Z_2$ of the second final stage amplifier Amp2 are $2R_L$ when α=1.

Thus, with the Doherty type RF power amplifier shown in FIG. 6, a high efficiency is achieved by power generation only by the low-biased first final stage amplifier Amp1 activating the load impedance $Z_1$ having a high impedance of $4R_L$ in a low power operation during which the signal amplitude of the RF input signal RF_In is at Low level. In a high power operation during which the signal amplitude of the RF input signal RF_In is at High level, the high-biased first and second final stage amplifiers Amp1 and Amp2 are saturated at a maximum power efficiency, and activates in parallel the load impedance $Z_1$, which is a middle impedance of $2R_L$, whereby full power is generated.

The high-power RF power amplifier used in a base station shown in FIG. 6 needs a length of about 4 to 8 cm for the ¼-wavelength output line Out_Tr_Ln and ¼-wavelength input line In_Tr_Ln. Therefore, the RF power amplifier shown in FIG. 5 is unsuitable as an RF power amplifier incorporated in a communication device terminal such as a portable phone which requires downsizing of parts. However, the RF power amplifier shown in FIG. 6 can be used as a high-power RF power amplifier for use in a base station which allows somewhat upsizing.

Figure 7:
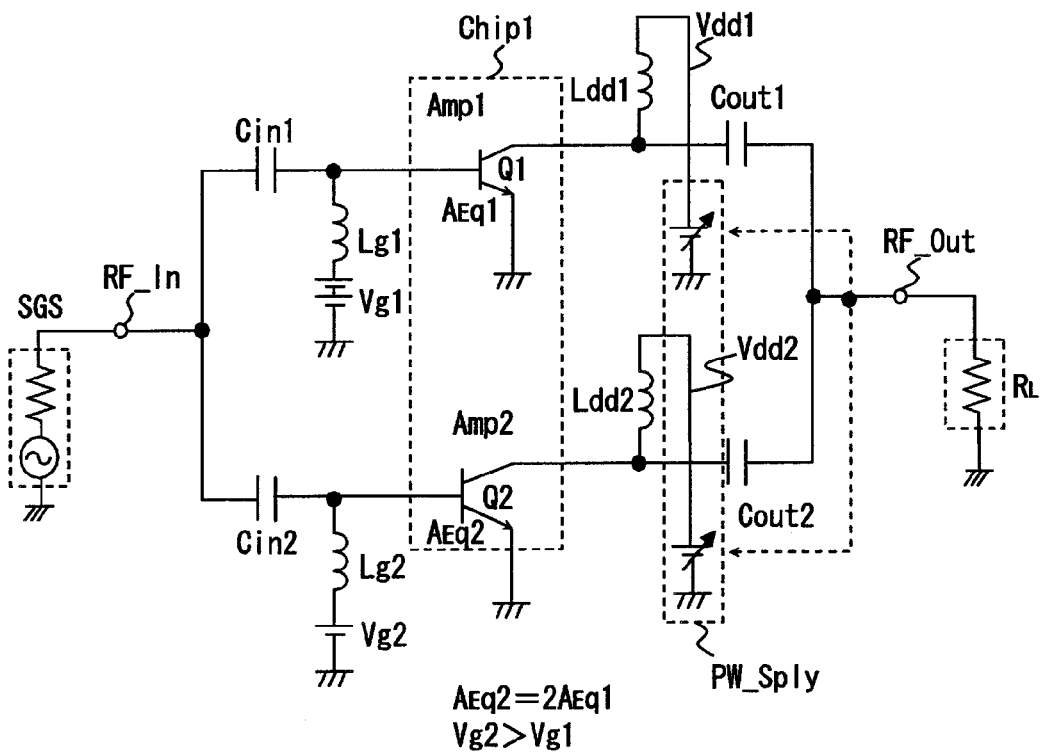
FIG. 7 is a circuit diagram showing an RF power amplifier in accordance with another embodiment of the invention, which is incorporated in a communication device terminal such as a portable phone.

FIG. 7 is a circuit diagram showing an RF power amplifier in accordance with another embodiment of the invention, which is incorporated in a communication device terminal such as a portable phone. The RF power amplifier shown in FIG. 7 is identical to that shown in FIG. 1 except that LDMOS transistors used as the first and second amplification devices Q1 and Q2 are replaced with HBTs (Hetero Bipolar Transistors). Therefore, the first effective device size of the first amplification device Q1 and the second effective device size of the second amplification device Q2 are an emitter area of each HBT or an emitter finger number. The emitter region of an HBT has a two-dimensional, comb-like shape, and teeth of the comb-like shape are termed fingers. The area of one emitter finger is a unit emitter area $A_E$, and therefore the total emitter area of an HBT having an emitter finger number of N (N>2) is given by $N \cdot A_E$. For example, in FIG. 7, the first amplification device Q1 is an HBT having an emitter finger number of 30, and the second amplification device Q2 is an HBT having an emitter finger number of 60.

Figure 11:
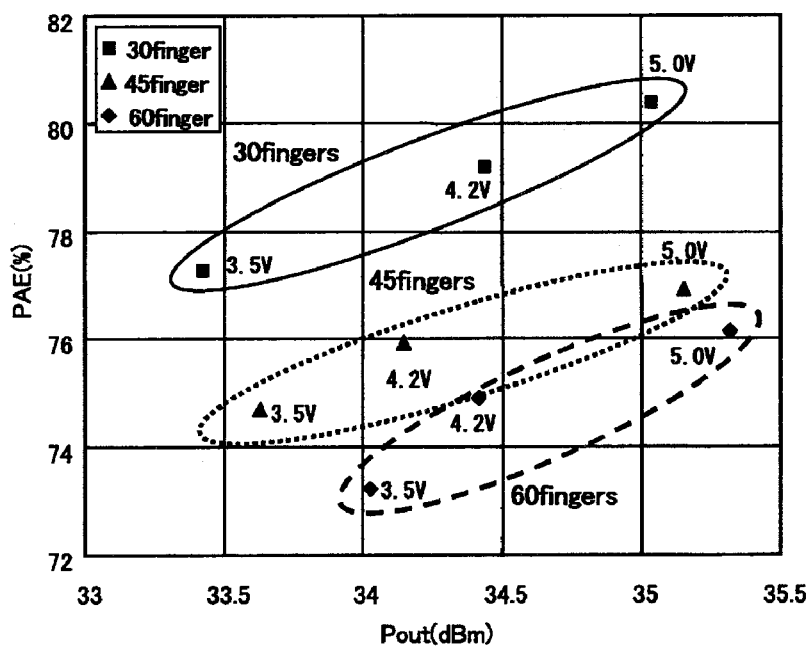
FIG. 11 is a plot showing the relation between the output power and the power-added efficiency when the emitter finger number of the HBT is changed to 30, 45 and 60.

FIG. 11 is a plot showing the relation between the output power $P_{out}$ (dBm) and the power-added efficiency PAE (%) when the emitter finger number of the HBT is changed to 30, 45 and 60. Here, comparisons are made between operations at 3.5 volts. Then, as shown in FIG. 11, with a small-scale HBT having an emitter finger number of 30, a high power-added efficiency PAE (%) of about 77.5% is gained in the case of a low output power $P_{out}$ (dBm) of about 33.4 dBm; for a middle-scale HBT with an emitter finger number or 45, a high power-added efficiency PAE (%) of about 74.5% is obtained in the case of a middle output power $P_{out}$ (dBm) of about 33.6 dBm; and for a large-scale HBT having an emitter finger number of 60, a relatively low power-added efficiency PAE (%) of about 73% is gained in the case of a high output power $P_{out}$ (dBm) of about 34 dBm.

Figure 8:
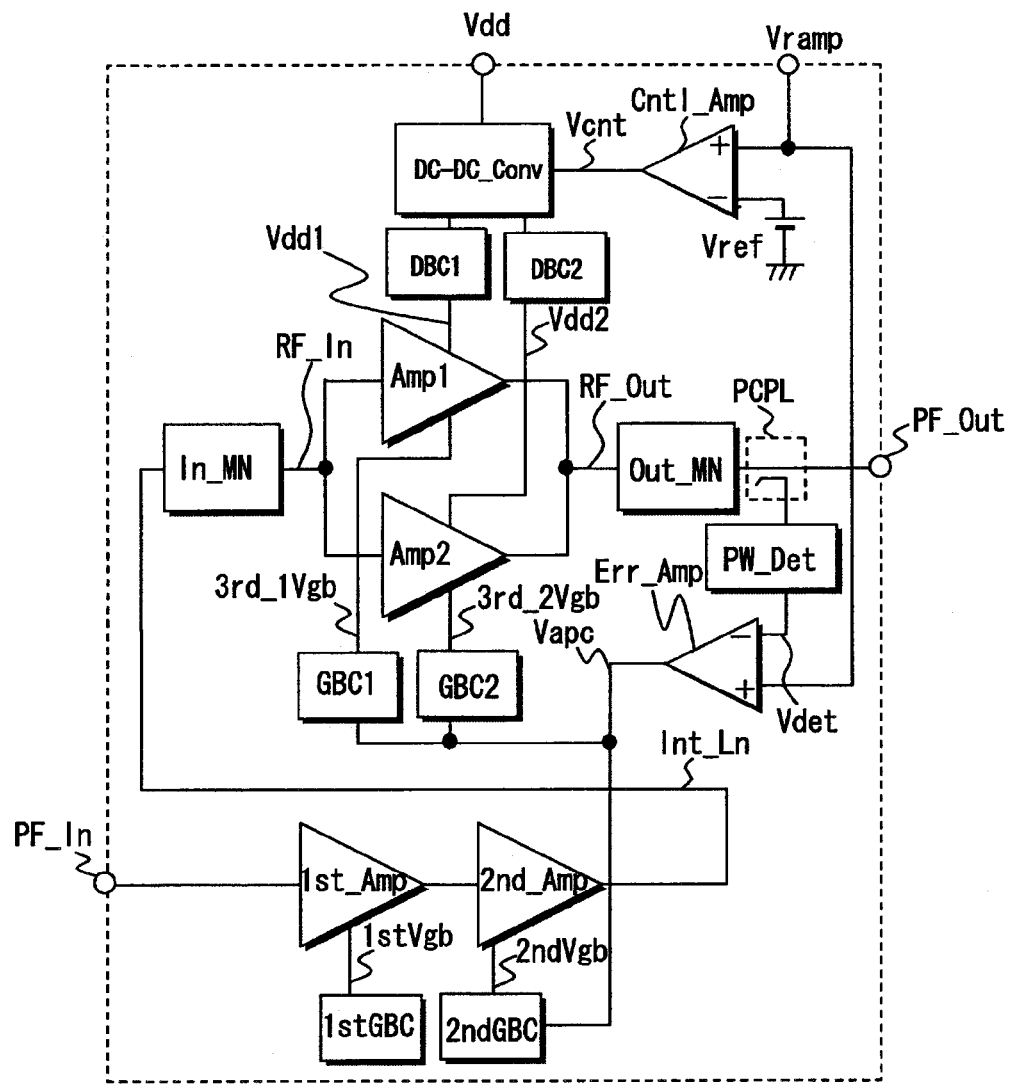
FIG. 8 is a circuit diagram showing an RF power amplifier in accordance with another embodiment of the invention, which is incorporated in a communication device terminal such as a portable phone.

FIG. 8 is a circuit diagram showing an RF power amplifier in accordance with another embodiment of the invention, which is incorporated in a communication device terminal such as a portable phone. The RF power amplifier shown in FIG. 8 differs from the RF power amplifier shown in FIG. 1 in the following points. The first point of difference is that the RF power amplifier in accordance with this embodiment includes a first-stage driving amplifier 1st_AMP and a second-stage driving amplifier 2nd_AMP, which activate inputs to the first and second final stage amplifiers Amp1 and Amp2 located in the final amplification stage and shown in FIG. 1 through an input matching circuit In_MN. An RF input signal from the RF input signal terminal RF_In is amplified by the first-stage driving amplifier 1st_AMP into an RF amplification signal. The RF amplification signal from the first-stage driving amplifier 1st_AMP is amplified by the second-stage driving amplifier 2nd_AMP into an RF amplification signal. Further, the RF amplification signal from the second-stage driving amplifier 2nd_AMP is amplified by the first and second final stage amplifiers Amp1 and Amp2 located in the final amplification stage. The RF amplification signals RF_Out from the first and second final stage amplifiers Amp1 and Amp2 in the final amplification stage are supplied to an antenna for transmission (not shown) through an output matching circuit Out_MN.

Figure 16:
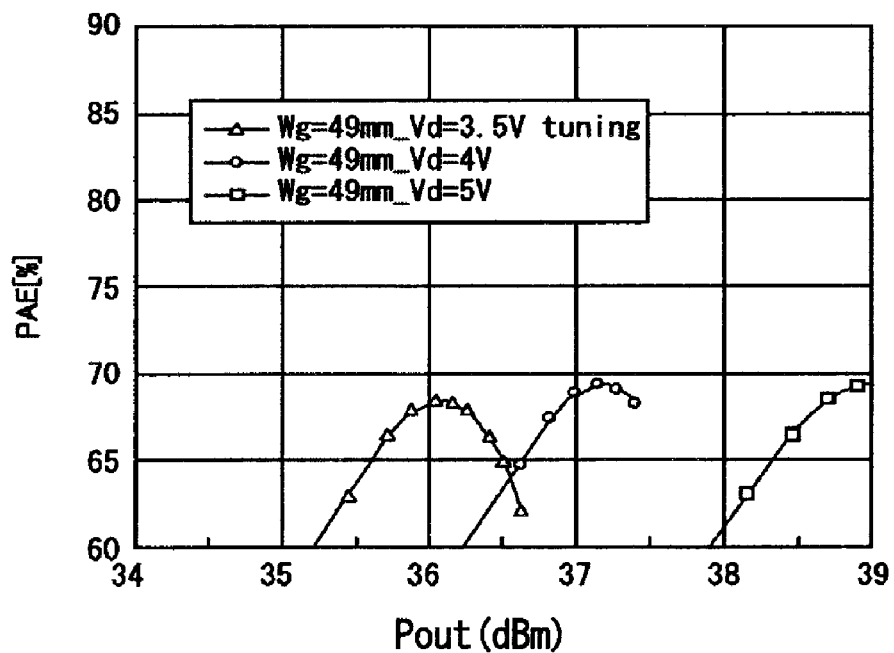
FIG. 16 is a plot showing the relation between the output power and power-added efficiency of the RF power amplifier which had been examined before the invention was made.
Figure 17:
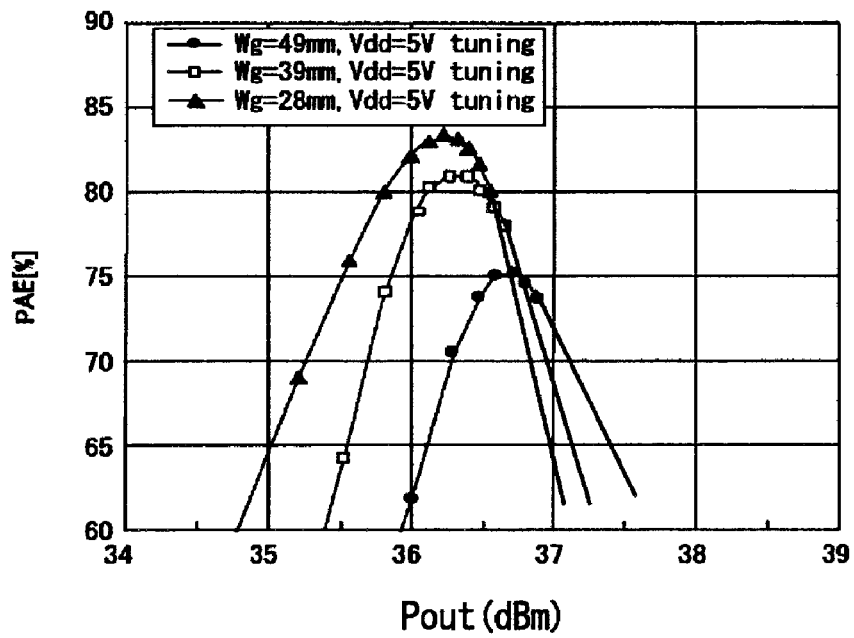
FIG. 17 is a plot showing the relation between the output power and the power-added efficiency when the gate width of an LDMOS transistor of an RF power amplifier examined prior to the invention is changed to 49, 39, and 28 mm.

The second point of difference of the RF power amplifier shown in FIG. 8 from that shown in FIG. 1 is addition of a function for controlling the level of a source voltage to be supplied to a drain or collector in response to the level of an RF amplification output signal PF_Out from the output matching circuit Out_MN. As already described in SECOND FINDING, when the output power $P_{out}$ of an RF power amplifier is high, use of a higher source voltage Vdd can improve the power-added efficiency PAE. In contrast, when the output power $P_{out}$ of an RF power amplifier is low, use of a lower source voltage Vdd can improve the power-added efficiency PAE. This can be understood from FIG. 16. Therefore, to realize such control function, an output signal Vcnt of the control amplifier Cntl_Amp which is supplied with a ramp voltage Vramp and a reference voltage Vref is used to control the DC output voltage of the DC-DC converter DC-DC_Conv. The ramp voltage Vramp is a transmission power-specifying signal for specifying a power sent to the RF power amplifier and proportional to the distance between a base station and the portable phone terminal tool, which is supplied to the RF power amplifier through an RF IC from a base band signal processing unit such as a base band LSI. The DC-DC converter DC-DC_Conv produces a DC output voltage from an external source voltage Vdd, which is a DC input voltage. When the ramp voltage Vramp is raised, the DC output voltage from the DC-DC converter DC-DC_Conv is increased while undergoing the control in accordance with the output signal Vcnt of the control amplifier Cntl_Amp. Reversely, when the ramp voltage Vramp is lowered, the DC output voltage from the DC-DC converter DC-DC_Conv is decreased while undergoing the control in accordance with the output signal Vcnt of the control amplifier Cntl_Amp. The DC output voltage is supplied through first and second source voltage supply circuits DBC1 and DBC2 to the drain or collector of the first and second final stage amplifiers Amp1 and Amp2 in the final amplification stage as a source voltage to be supplied to a drain or collector. The first and second source voltage supply circuits DBC1 and DBC2 produce first and second source voltages Vdd1 and Vdd2 respectively.

The third point of difference of the RF power amplifier shown in FIG. 8 from that shown in FIG. 1 is addition of a APC control function for controlling the level of an RF amplification output signal PF_Out of the output matching circuit Out_MN in the level of the ramp voltage Vramp (APC: Automatic Power Control). Therefore, for materialization of such control function, the level of the RF amplification output signal PF_Out is detected, and the total gain of the RF power amplifier is controlled based on the result of detection.

The RF power amplification signal PF_Out of the first and second final stage amplifiers Amp1 and Amp2 of the final amplification stage gained through the output matching circuit Out_MN is partially supplied to an input terminal of a power detector PW_Det through a power coupler PCPL for power level detection. A power level detection output signal Vdet from an output of the power detector PW_Det is supplied to an inverting input terminal (−) of an error amplifier Err_Amp. On the other hand, the ramp voltage Vramp is supplied to a non-inverting input terminal (+) of the error amplifier Err_Amp. Hence, when the ramp voltage Vramp is raised, the levels of input bias voltages supplied to the gate or base of the first-stage and second-stage driving amplifiers 1st_AMP and 2nd_AMP from first-stage and second-stage driving input bias circuits 1stGBC and 2ndGBC are increased. As a result, the amplification gains of the first-stage and second-stage driving amplifiers 1st_AMP and 2nd_AMP are raised, whereby the levels of an RF input signals supplied to the input terminals of the first and second final stage amplifiers Amp1 and Amp2 in the final amplification stage are increased. Also, when the ramp voltage Vramp is raised, the level of an input bias voltage supplied to the gate or base of each of the first and second final stage amplifiers Amp1 and Amp2 in the final amplification stage through first and second final stage input bias circuits GBC1 and GBC2 is raised likewise. Further, when the ramp voltage Vramp is raised, the DC output voltage of the DC-DC converter DC-DC_Conv is also raised. The DC output voltage is supplied to the drain or collector of the first and second final stage amplifiers Amp1 and Amp2 in the final amplification stage through the first and second source voltage supply circuits DBC1 and DBC2 as a source voltage to be supplied to the drain or collector.

In contrast, when the level of the RF power amplification signal PF_Out is excessively high in comparison to the level of the supplied ramp voltage Vramp, the total gain of the RF power amplifier is lowered by APC control. When the level of the RF power amplification signal PF_Out is excessively high, the output level of the power detector PW_Det is raised, and the output level of the error amplifier Err_Amp is lowered. As a result, the level of an input bias voltage supplied to the gate or base of the first-stage and second-stage driving amplifiers 1st_AMP and 2nd_AMP from the first-stage and second-stage driving input bias circuits 1stGBC and 2ndGBC is lowered. Also, the level of an input bias voltage supplied to the gate or base of the first and second final stage amplifiers Amp1 and Amp2 in the final amplification stage through the first and second final stage input bias circuits GBC1 and GBC2 is lowered likewise. In this way the total gain of the RF power amplifier is lowered by APC control.

It is desirable that the DC-DC converter DC-DC_Conv of the RF power module shown in FIG. 8 for producing a level-controlled DC output voltage from an external source voltage Vdd supplied from the outside is reduced-power consumption type one.

Figure 9:
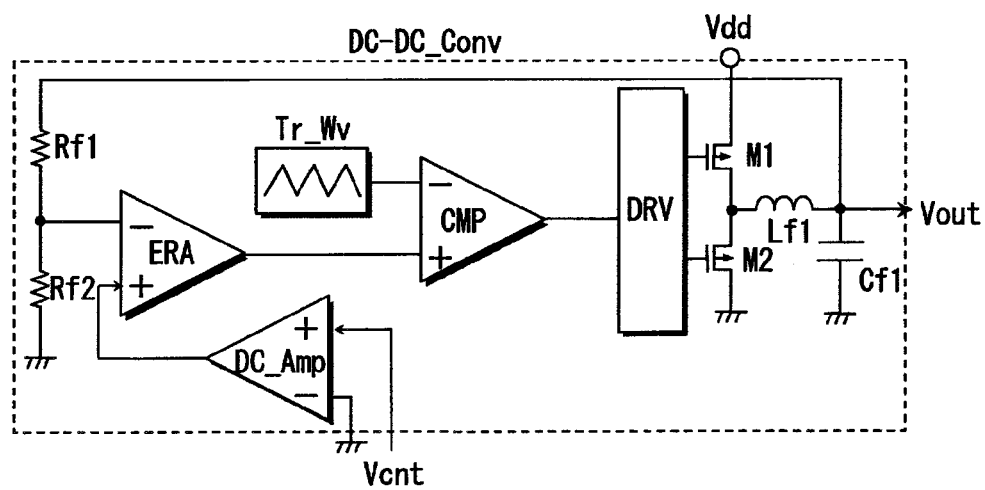
FIG. 9 is a circuit diagram showing a circuit configuration of a switching regulator type DC-DC converter DC-DC_Conv which has a characteristic of low power consumption and is used in the RF power amplifier shown in FIG. 8.

FIG. 9 is a circuit diagram showing a circuit configuration of a switching regulator type DC-DC converter DC-DC_Conv having a characteristic of such low power consumption.

As shown in the drawing, the level of the level-controlled DC output voltage Vout is controlled in accordance with a duty ratio of ON period of a power MOS transistor M1 used as a high-side switch and ON period of a power MOS transistor M2 used as a low-side switch. The DC output voltage Vout smoothed by a low-pass filter constituted by a coil Lf1 and a capacitor Cf1 is supplied to an inverting input terminal (−) of an error amplification circuit ERA through negative feedback voltage-dividing resistors Rf1 and Rf2. The control voltage Vcnt from an output of the control amplifier Cntl_Amp shown in FIG. 8 undergoes DC amplification by a DC amplifier DC_Amp. A DC output voltage from the DC amplifier DC_Amp is supplied to a non-inverting input terminal (+) of the error amplification circuit ERA. A DC output voltage from the error amplification circuit ERA is supplied to a non-inverting input terminal (+) of a voltage comparator CMP. To an inverting input terminal (−) of the voltage comparator CMP, a reference triangular wave signal for PWM (Pulse Width Modulation) control generated by a triangular wave signal generator Tr_Wv is supplied.

When the level of a DC output voltage Vout smoothed by the low-pass filter reduces, the level of a DC output voltage of the error amplification circuit ERA rises. Then, the width of a low-level pulse of a PWM output from the voltage comparator CMP is shortened. Further, ON period of the power MOS transistor M1 used as a high-side switch is made longer, whereas ON period of the power MOS transistor M2 used as a low-side switch is made shorter. As a result, negative feedback control is performed so that the level of the DC output voltage Vout is raised.

On the other hand, when the level of the control voltage Vcnt is raised, the level of a DC output voltage of the error amplification circuit ERA is increased. Then, the width of a low level pulse of a PWM output from the voltage comparator CMP is shortened. As a result, ON period of the power MOS transistor M1 used as a high-side switch is made longer, and ON period of the power MOS transistor M2 used as a low-side switch is made shorter. As a result, the level of the DC output voltage Vout is raised.

Figure 10:
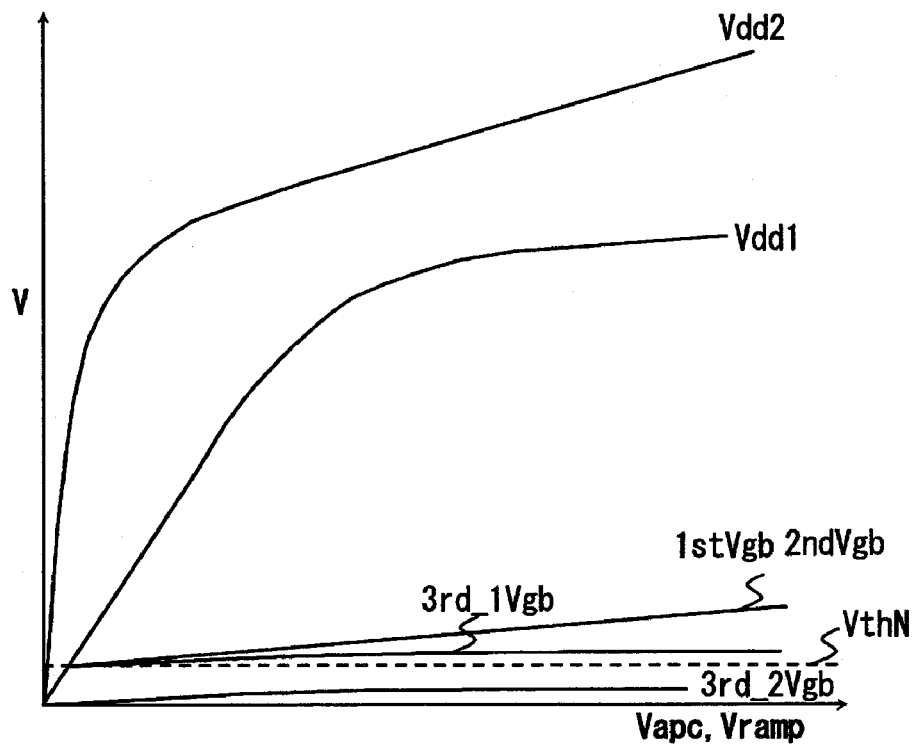
FIG. 10 is a plot showing how the level of an input bias voltage of the first-stage and second-stage driving amplifiers, the level of an input bias voltage of the first and second final stage amplifiers in the final amplification stage, and the level of a source voltage of the first and second final stage amplifiers in the final amplification stage are controlled with respect to an APC control voltage and a ramp voltage of the RF power amplifier in accordance with the embodiment of the invention shown in FIG. 8.

FIG. 10 is a plot showing how the following three levels are controlled with respect to the APC control voltage Vapc and the ramp voltage Vramp in the RF power amplifier shown in FIG. 8: (1) the level of an input bias voltage of the first-stage and second-stage driving amplifiers 1st_AMP and 2nd_AMP; (2) the level of an input bias voltage of the first and second final stage amplifiers Amp1 and Amp2 in the final amplification stage; and (3) the level of a source voltage of the first and second final stage amplifiers Amp1 and Amp2 in the final amplification stage.

As already described, the level of an input bias voltage of the first-stage and second-stage driving amplifiers 1st_AMP and 2nd_AMP of the RF power amplifier, and the level of an input bias voltage of the first and second final stage amplifiers Amp1 and Amp2 in the final amplification stage are controlled in accordance with the level of an APC control voltage Vapc. The level of a source voltage of the first and second final stage amplifiers Amp1 and Amp2 in the final amplification stage is controlled in accordance with the level of the ramp voltage Vramp.

In the drawing, the input bias voltage 1stVgb of the first-stage driving amplifier 1st_AMP, the input bias voltage 2ndVgb of the second-stage driving amplifier 2nd_AMP, and the input bias voltage 3rd_11Vgb of the first amplification device Q1 of Class AB of the first final stage amplifier Amp1 in the final amplification stage are higher than the gate threshold voltage VthN (0.8 volts) of the N-channel MOS transistor from the beginning, and rises in proportion to an increase of the APC control voltage Vapc. On the other hand, while the input bias voltage 3rd_2Vgb of the class-C second amplification device Q2 of the second final stage amplifier Amp2 in the final amplification stage rises in proportional to an increase of the APC control voltage Vapc, it is set to be lower than the gate threshold voltage VthN (0.8 volts) of the N-channel MOS transistor.

When the APC control voltage Vapc is at Low level, the first source voltage Vdd1 supplied to the drain of the class-AB first amplification device Q1 of the first final stage amplifier Amp1 in the final amplification stage is also controlled to be at to Low level. As a result, the power-added efficiency PAE when the class-AB first amplification device Q1 having a small device size produces a low output power $P_{out}$ can be improved. In addition, when the ramp voltage Vramp is at High level, the second source voltage Vdd2 supplied to the drain of the class-C second amplification device Q2 of the second final stage amplifier Amp2 in the final amplification stage is also controlled to be at High level. As a result, the power-added efficiency PAE when the class-C second amplification device Q2 having a large device size produces a high output power $P_{out}$ can be improved. In contrast, when the ramp voltage Vramp is at Low level, the first source voltage Vdd1 supplied to the drain of the class-AB first amplification device Q1 of the first final stage amplifier Amp1 in the final amplification stage is also controlled to be at Low level. As a result, the power-added efficiency PAE when the class-AB first amplification device Q1 having a small size produces a low output power $P_{out}$ can be improved.

Figure 12:
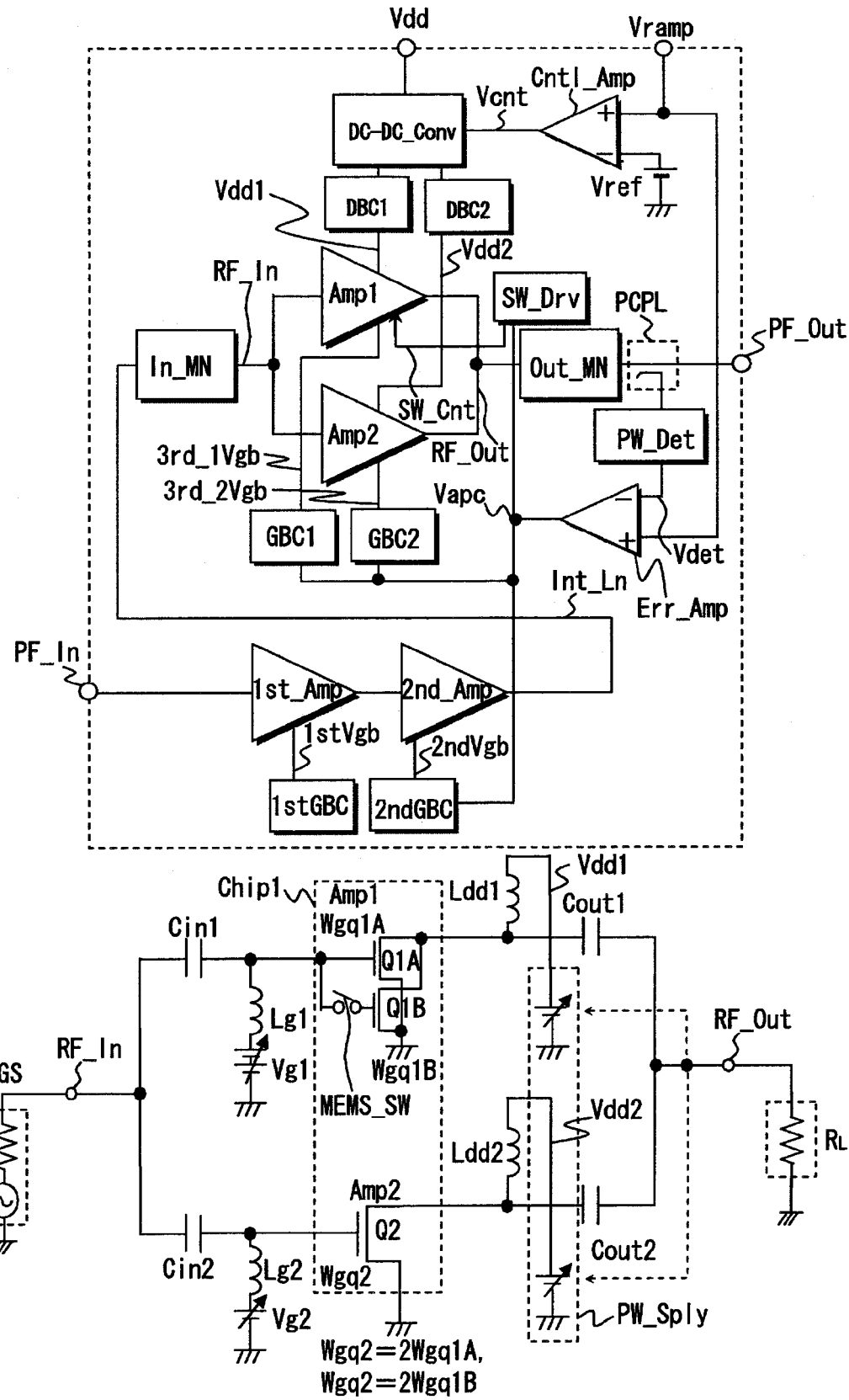
FIG. 12 is a circuit diagram showing an RF power amplifier in accordance with another embodiment of the invention, which is incorporated in a communication device terminal such as a portable phone.

FIG. 12 is a circuit diagram showing an RF power amplifier in accordance with another embodiment of the invention, which is incorporated in a communication device terminal such as a portable phone. The RF power amplifier shown in FIG. 12 differs from the RF power amplifier shown in FIG. 8 in the following points. The first point of difference is that the first final stage amplifier Amp1 in the final amplification stage includes a third amplification device Q1B connected with an input and output of the first amplification device Q1A in parallel. The first amplification device Q1A, the third amplification device Q1B and the second amplification device Q2 are identical N-channel LDMOSs made on a common semiconductor chip Chip1 by the same manufacturing process. The gate width Wgq1A of the first amplification device Q1A and the gate width Wgq1B of the third amplification device Q1B are set to be substantially half of the gate width Wgq2 of the second amplification device Q2.

The second point of difference of the RF power amplifier shown in FIG. 12 from that shown in FIG. 8 is that a MEMS switch MEMS_SW is connected between the input terminal of the first amplification device Q1A and the input terminal of the third amplification device Q1B, and ON and OFF operations of the MEMS switch MEMS_SW are controlled in accordance with a switch driving signal SW_Cnt supplied from a switch drive circuit SW_Drv. The MEMS switch MEMS_SW can be made on the semiconductor chip where the first amplification device Q1A, third amplification device Q1B and second amplification device Q2 are formed, in which the manufacturing process for making the MEMS switch may be the same as that used in forming the first to third amplification devices, as described in Nonpatent Document 4. The switch drive circuit SW_Drv is supplied with the APC control voltage Vapc from the error amplifier Err_Amp.

When the RF power output $P_{out}$ of the RF power amplifier is at Low or Middle level, the APC control voltage Vapc from the error amplifier Err_Amp is also at Low level. The MEMS switch MEMS_SW is controlled to be in OFF state and the third amplification device Q1B is controlled to be in OFF state, in accordance with the low-level switch driving signal SW_Cnt from the switch drive circuit SW_Drv.

When the RF power output $P_{out}$ of the RF power amplifier is at Low or Middle level, the first bias voltage 3rd_1Vgb (Vg1) of the input terminal of the first amplification device Q1A is set to be higher than the second bias voltage 3rd_2Vgb (Vg2) of the input terminal of the second amplification device Q2, as in the case of the RF power amplifier shown in FIG. 8. Thus, the first amplification device Q1A is arranged so as to work in any one of the operating classes from Class B with a conduction angle of π (180°) to Class AB with a conduction angle of π (180°) to 2π (360°), and the second amplification device Q2 is arranged so as to work in Class C with a conduction angle below π (180°).

As a result, when the RF power output $P_{out}$ of the RF power amplifier is at a level between the low and middle levels, in the RF power amplifier shown in FIG. 12 a high power-added efficiency PAE can be achieved with respect to an RF power output $P_{out}$ at a level between the low and middle levels as in the case of the RF power amplifier shown in FIG. 8.

When the RF power output $P_{out}$ of the RF power amplifier is at High level, the APC control voltage Vapc from the error amplifier Err_Amp is at High level, the MEMS switch MEMS_SW is controlled to be in ON state in accordance with the high-level switch driving signal SW_Cnt from the switch drive circuit SW_Drv, and the third amplification device Q1B is controlled to be in ON state.

When the RF power output $P_{out}$ of the RF power amplifier is at High level, the first bias voltage 3rd_1Vgb (Vg1) for the input terminals of the first and third amplification devices Q1A and Q1B, and the second bias voltage 3rd_2Vgb (Vg2) for the input terminal of the second amplification device Q2 are set so that the first and third amplification devices Q1A and Q1B are each operational in any one of the operating classes between Class B with a conduction angle of π (180°) and Class AB with a conduction angle of π (180°) to 2π (360°), and the second amplification device Q2 is also operational in any one of the operating classes between Class B with a conduction angle of π (180°) and Class AB with a conduction angle of π (180°) to 2π (360°).

As a result, when the RF power output $P_{out}$ of the RF power amplifier is at High level, the RF power amplifier shown in FIG. 12 forms a DD-CIMA type power amplifier. Therefore, a high power-added efficiency PAE can be achieved when the RF power output $P_{out}$ is at High level.

The RF power amplifier shown in FIG. 12 may be configured similarly to the RF power amplifier shown in FIG. 8. For example, the DC-DC Converter DC-DC_Conv of the RF power amplifier shown in FIG. 12 may be composed of the switching regulator shown in FIG. 9. In addition, the first amplification device Q1A, the third amplification device Q1B and the second amplification device Q2 may be LDMOSs or HBTs formed on the same semiconductor chip Chip1 by the same manufacturing process.

Figure 13:
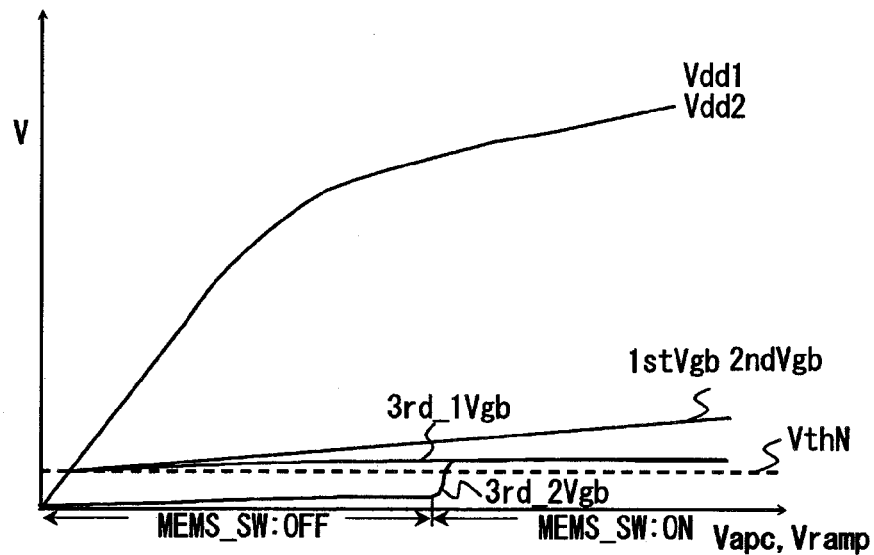
FIG. 13 is a plot showing how the following three levels are controlled with respect to the APC control voltage and the ramp voltage in the RF power amplifier shown in FIG. 12: (1) the level of the input bias voltage for the first-stage and second-stage driving amplifiers; (2) the level of the input bias voltage of the first and second final stage amplifiers in the final amplification stage; and (3) the level of the source voltage of the first and second final stage amplifiers in the final amplification stage.

FIG. 13 is a plot showing how the following three levels are controlled with respect to the APC control voltage Vapc and the ramp voltage Vramp in the RF power amplifier shown in FIG. 12: (1) the level of the input bias voltage for the first-stage and second-stage driving amplifiers 1st_AMP and 2nd_AMP; (2) the level of the input bias voltage of the first and second final stage amplifiers Amp1 and Amp2 in the final amplification stage; and (3) the level of the source voltage of the first and second final stage amplifiers Amp1 and Amp2.

As shown in the drawing, when the RF power output $P_{out}$ of the RF power amplifier becomes High level, the APC control voltage Vapc from the error amplifier Err_Amp also becomes High level, and the MEMS switch MEMS_SW is controlled to be in ON state. Then, the third amplification device Q1B begins an operation in Class AB, whereby a class-AB operation is started in parallel with the first and third amplification devices Q1A and Q1B. Almost concurrently with this, the second bias voltage 3rd_2Vgb (Vg2) of the second amplification device Q2 is changed from a state below the gate threshold voltage VthN to a state above the gate threshold voltage, and then the operation that the second amplification device Q2 performs is changed from a class-C operation to a class-AB operation.

Top View of Device as Application of RF Power Amplifier Module

Figure 14:
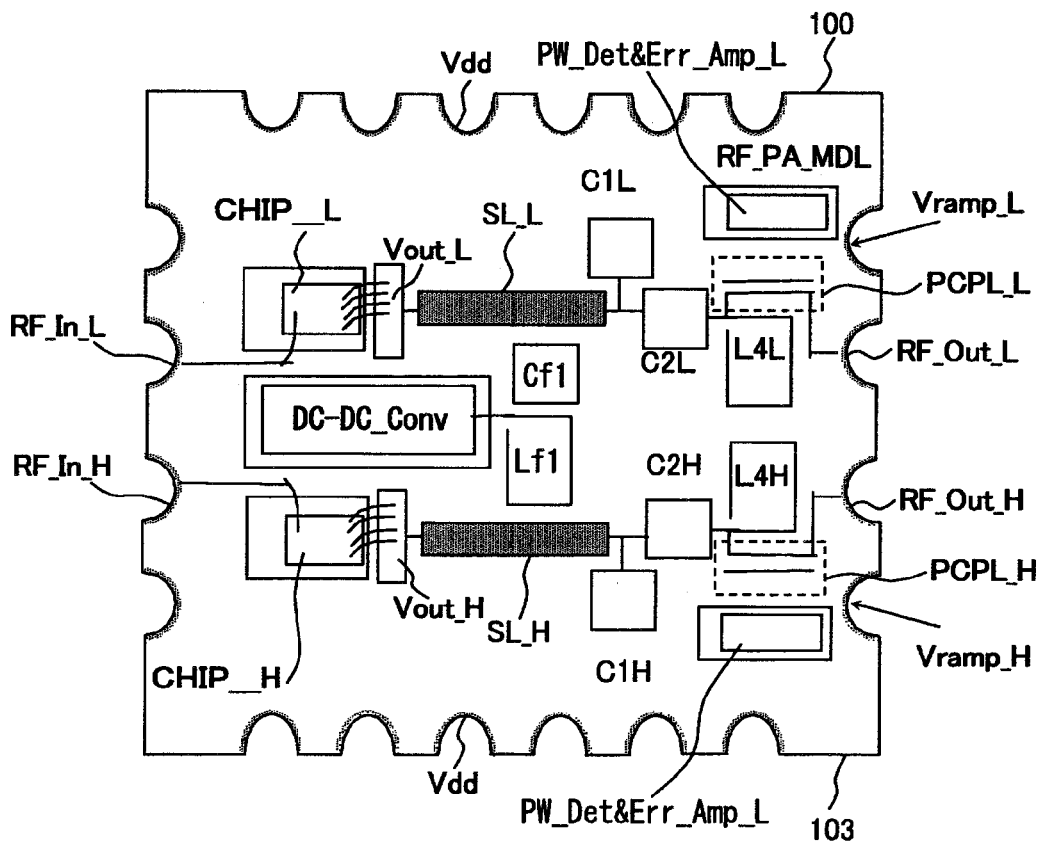
FIG. 14 is a top view of a device including an RF power amplifier module in accordance to an embodiment of the invention.
Figure 15:
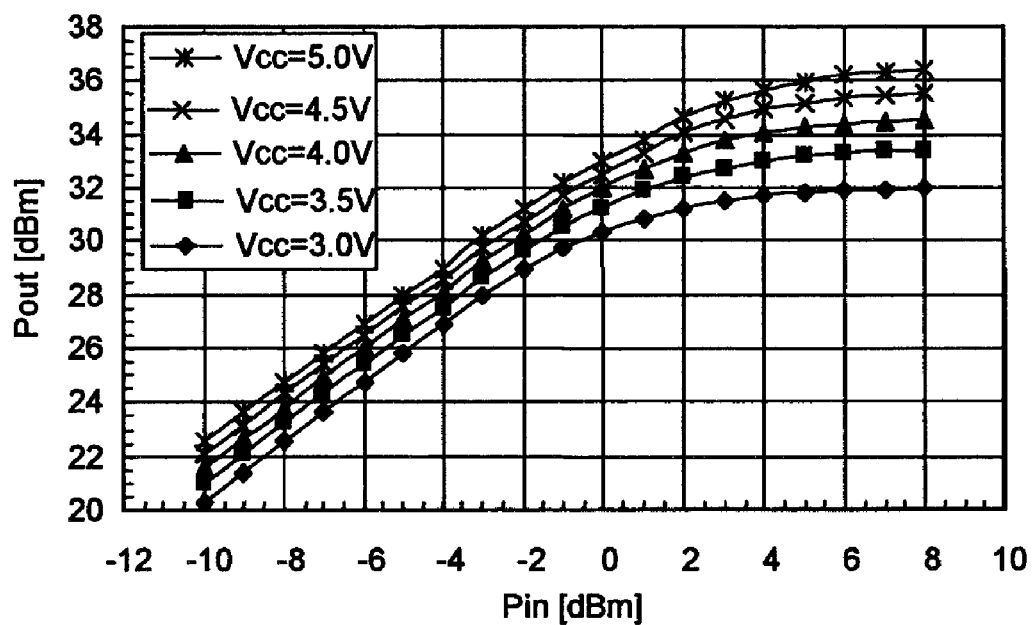
FIG. 15 is a plot showing the relation between the input power and output power of an RF power amplifier which had been examined before the invention was made.

FIG. 14 is a top view of a device including an RF power amplifier module in accordance to an embodiment of the invention. As shown in the drawing, an RF power amplifier for a low RF band between about 800 and about 900 MHz is disposed on an upper half portion of the device including the RF power amplifier module 100, and an RF power amplifier for a high RF band near a range of about 1600 to about 1800 MHz is disposed on a lower half portion of the device. The multilayer wiring board 103 of the RF power amplifier module 100 has a quadrangular shape. Along each side of the quadrangular shape, a plurality of external connection terminals each having a semicircular shape are formed. The semicircular external connection terminals are connected with plural segments of wiring on a motherboard of a mobile communication terminal device such as a portable phone by soldering. The plurality of external connection terminals is not limited to the semicircular shape, and it may take the form of straight line.

To the external connection terminals located along the left side of the quadrangular shape, a low RF input signal RF_In_L and a high RF input signal RF_In_H are supplied. To the external connection terminals located along the upper and lower sides of the quadrangular shape, an external source voltage Vdd for a first low RF power amplifier chip CHIP_L and an external source voltage Vdd for a second high RF power amplifier chip CHIP_H are supplied respectively. The first low RF power amplifier chip CHIP_L and the second high RF power amplifier chip CHIP_H each include the first-stage and second-stage driving amplifiers 1st_AMP and 2nd_AMP, and the first and second final stage amplifiers Amp1 and Amp2, which are shown in FIG. 8 or FIG. 12. The low and high RF input signals RF_In_L and RF_In_H, which are input to the terminals located along the left side of the quadrangular shape, are respectively supplied through wiring lines to base inputs of first-stage amplification transistors Q1L and Q1H of the first-stage during amplifier 1st_AMP of the first low RF power amplifier chip CHIP_L and the second high RF power amplifier chip CHIP_H. Final-stage amplification output signals of the first low RF power amplifier chip CHIP_L and second high RF power amplifier chip CHIP_H are each connected through four wiring lines for increasing current capacity to output pads Vout_L and Vout_H. The output pads Vout_L and Vout_H are connected to one ends of strip lines SL_L and SL_H of first and second output matching circuits. The other ends of the strip lines SL_L and SL_H are connected to capacitors C1L and C1H of the first and second output matching circuits and connected to one ends of capacitors C2L and C2H of first and second high-pass filters, respectively. The other ends of the capacitors C2L and C2H of first and second high-pass filters are connected to inductors L4L and L4H of first and second high-pass filters respectively. The other ends of the capacitors C2L and C2H of the first and second high-pass filters are also connected to two RF output signal terminals RF_Out_L and RF_Out_H located along the right side of the quadrangular shape respectively. Also, through the terminals located along the right side of the quadrangular shape, a low ramp voltage Vramp_L and a high ramp voltage Vramp_H are supplied to a low RF power detection and error amplification circuit chip PW_Det&Err_Amp_L and a high RF power detection and error amplification circuit chip PW_Det&Err_Amp_H. In a substantially halfway portion between the first low RF power amplifier chip CHIP_L and the second high RF power amplifier chip CHIP_H are disposed a semiconductor chip composed of a DC-DC Converter DC-DC_Conv shown in FIG. 9, and a coil Lf1 and a capacitor chip Cf1 which constitute a low-pass filter; the DC-DC Converter and the low-pass filter are shared by the RF power amplifier chips.

Next, Embodiments A to L as other embodiments of the invention will be described.

Embodiment A

Figure 18:
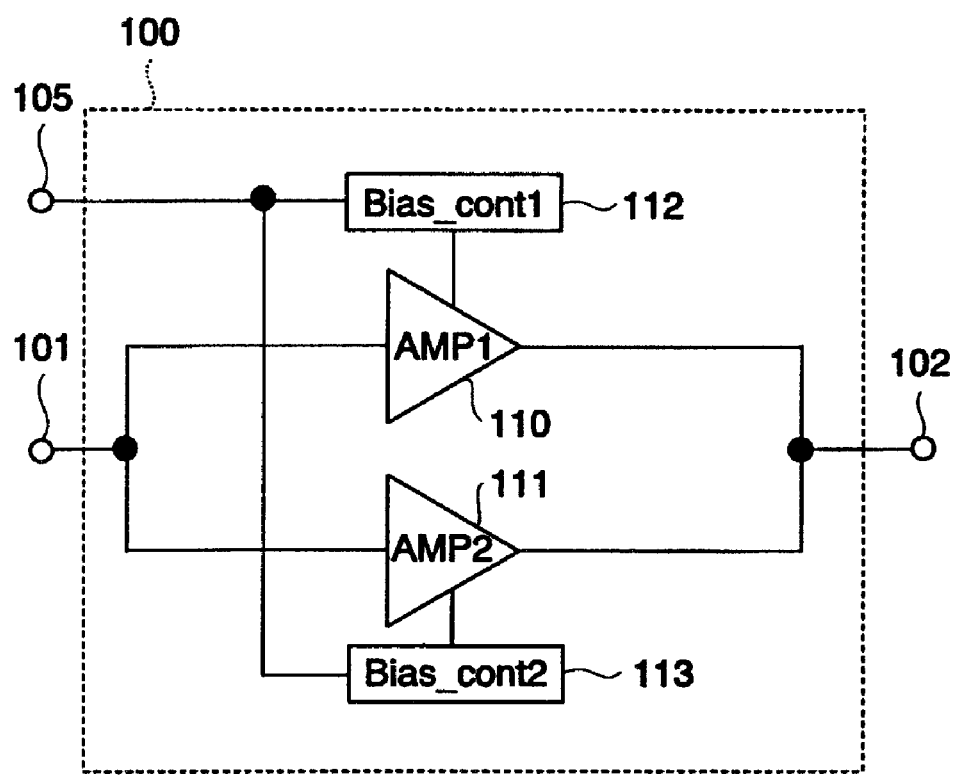
FIG. 18 is a block diagram showing a high-frequency power amplifier in accordance with Embodiment A of the invention.

FIG. 18 is a block diagram showing a high-frequency power amplifier of Embodiment A in association with the invention. The high-frequency power amplifier 100 of Embodiment A includes: a plurality of power amplifiers (AMP1) 110 and (AMP2) 111 disposed in parallel (two power amplifiers are exemplified here); and a plurality of bias control circuits (Bias_cont1) 112 and (Bias_cont2) 113, each controlling corresponding one of the plurality of power amplifiers 110 and 111 in bias in accordance with a method of modulating an input signal, which are formed on a monolithic board. The power amplifiers 110 and 111 each have an input terminal connected to a high-frequency signal input terminal 101 through a signal distributing part, and an output terminal connected to a high-frequency signal output terminal 102 through a signal synthesizing part. The bias control circuits 112 and 113 each have an input terminal connected to a modulation signal information input terminal 105, and an output terminal connected to a control terminal of corresponding one of the power amplifiers 110 and 111.

In this high-frequency power amplifier 100, a high-frequency signal input through the high-frequency signal input terminal 101 is distributed in the signal distributing part and input to the power amplifiers 110 and 111. The high-frequency signals which have undergone amplification by the respective power amplifiers 110 and 111 are combined in the signal synthesizing part and output through the high-frequency signal output terminal 102. In this operation flow, the bias control circuit 112 for the power amplifier 110 and the bias control circuit 113 for the power amplifier 111 each receive modulation signal information, i.e. information on a method of modulating an input signal, through the modulation signal information input terminal 105, thereby to set the bias of the relevant power amplifier to a value corresponding to the modulation wave signal, provided that such information includes a kind of a modulation wave and modulation wave signal's power, and is provided from a base band part, an RF IC part or the like.

Figures 19, 20:
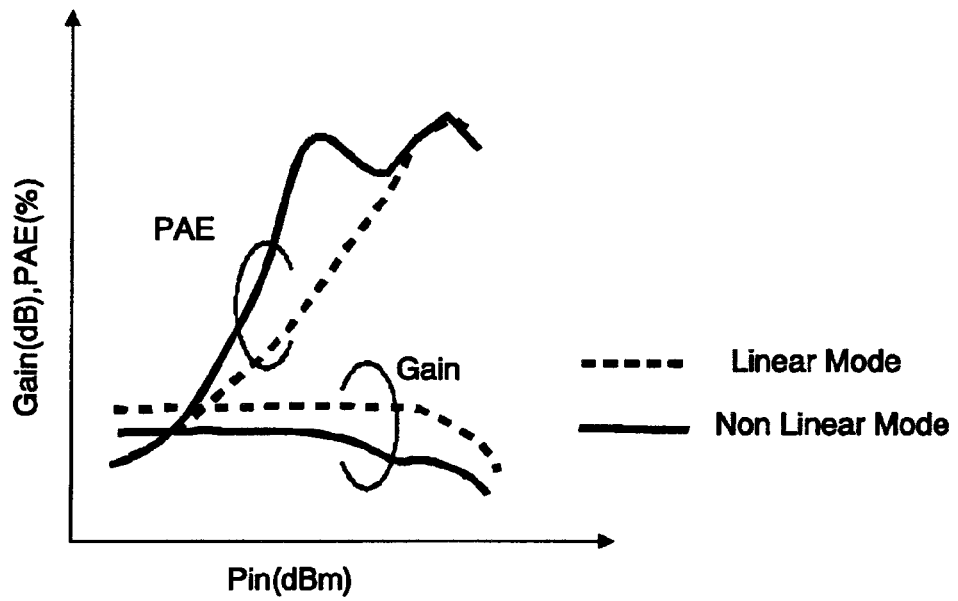
FIG. 19 is a table showing biasing conditions in modulation in bias control circuits in the high-frequency power amplifier in accordance with Embodiment A of the invention.
FIG. 20 is a plot showing an input power vs. power gain curve, and an input power vs. power-added efficiency curve in the high-frequency power amplifier in accordance with Embodiment A of the invention.

For example, based on the information about a modulation signal from the modulation signal information input terminal 105, the biasing conditions in modulation in the bias control circuits are as shown in FIG. 19. In the case where information that the input signal is one which has been modulated in accordance with CDMA, WCDMA or the like is offered through the modulation signal information input terminal 105, the biases of the power amplifiers 110 and 111, which have been disposed in parallel so that the power amplifier 100 works as a linear amplifier, are set to be common to the power amplifiers and to make the power amplifiers operational in one of Classes A to B (linear amplification mode). Further, in the case where information that the input signal is one which has been modulated in accordance with GSM or the like is offered through the modulation signal information input terminal 105, the power amplifier 100 does not need to work as a linear amplifier, and therefore the bias of one of the two power amplifiers 110 and 111 disposed in parallel is changed and set so that the one power amplifier becomes operational in one of Classes B to C to increase the efficiency of the whole amplifier (nonlinear amplification mode). Incidentally, the one power amplifier whose bias is changed is the power amplifier 111 in FIG. 19.

Hence, in accordance with this embodiment, as the high-frequency power amplifier is brought to the linear amplification mode or nonlinear amplification mode in the manner as stated above, the characteristics of the power amplifier can be made continuous. The switching to the linear amplification mode or the nonlinear amplification mode, the use of which will be started does not lead to the switching in characteristics between the linear and nonlinear modes depending on the amount of input power (Pin) as shown in FIG. 20. Thus, it becomes possible to provide a high-frequency power amplifier in which sharp and rapid changes in power gain (Gain), power-added efficiency (PAE), phase difference, etc. are suppressed.

The high-frequency power amplifier 100 in accordance with this embodiment may include: a power distributing circuit provided in the signal distributing part for supplying an input signal to the two power amplifiers 110 and 111 disposed in parallel on the input side of the power amplifiers; and a power synthesizing circuit provided in the signal synthesizing part for synthesizing high-frequency signals after amplification by the power amplifiers 110 and 111 on the output side of the power amplifiers, for example. The same thing can be said for the embodiments described below.

In accordance with this arrangement, a high-frequency signal input through the high-frequency signal input terminal 101 is made to diverge by the power distributing circuit, and input to the power amplifiers 110 and 111. The high-frequency signals resulting from amplification by the power amplifiers 110 and 111 are synthesized by the power synthesizing circuit and output from the high-frequency signal output terminal 102. With this arrangement, the same effects can be achieved.

Embodiment B

Figure 21:
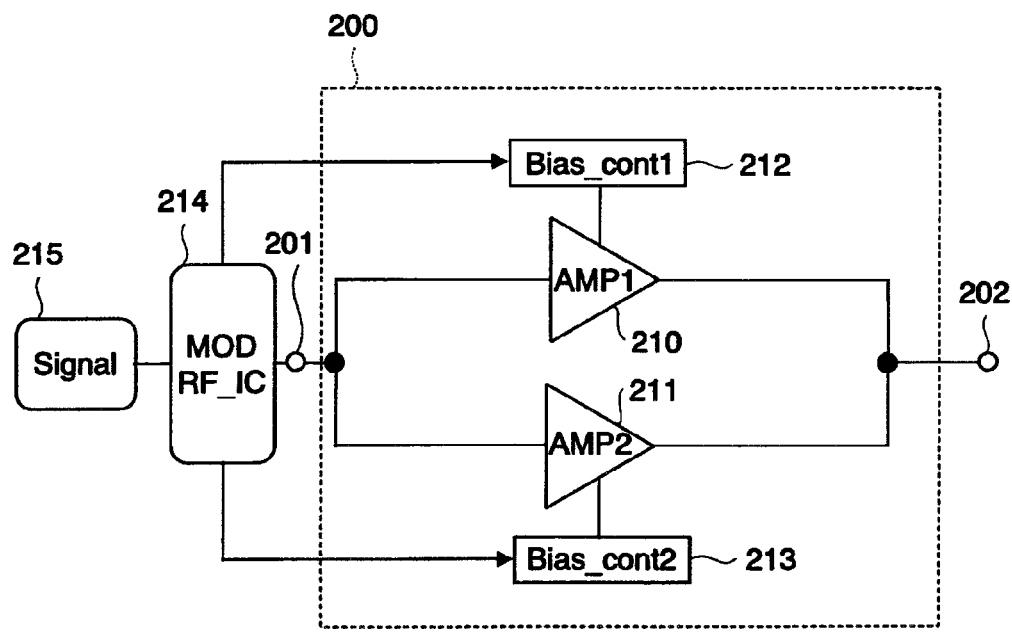
FIG. 21 is a block diagram showing a high-frequency power amplifier in accordance with Embodiment B of the invention.

FIG. 21 is a block diagram showing a high-frequency power amplifier in accordance with Embodiment B of the invention. The high-frequency power amplifier 200 in accordance with this embodiment includes: power amplifiers (AMP1) 210 and (AMP2) 211; bias control circuits (Bias_cont1) 212 and (Bias_cont2) 213; a high-frequency signal input terminal 201; and a high-frequency signal output terminal 202. Further, the high-frequency power amplifier has an RF_IC part (MOD RF_IC) 214 including a signal modulation part and a signal source (Signal) 215 connected thereto from the outside.

In the high-frequency power amplifier 200 in accordance with this embodiment, the RF_IC part 214 including the signal modulation part offers modulation signal information. A high-frequency signal to be input to the high-frequency signal input terminal 201 of the high-frequency power amplifier 200 is sent from the external signal source 215 through the RF_IC part 214 to the input terminal. Other operations are the same as those of the high-frequency power amplifier in accordance with Embodiment A.

Therefore, with this embodiment, the same effect as that achieved in Embodiment A can be obtained by taking modulation signal information from the RF_IC part 214.

Embodiment C

Figure 22:
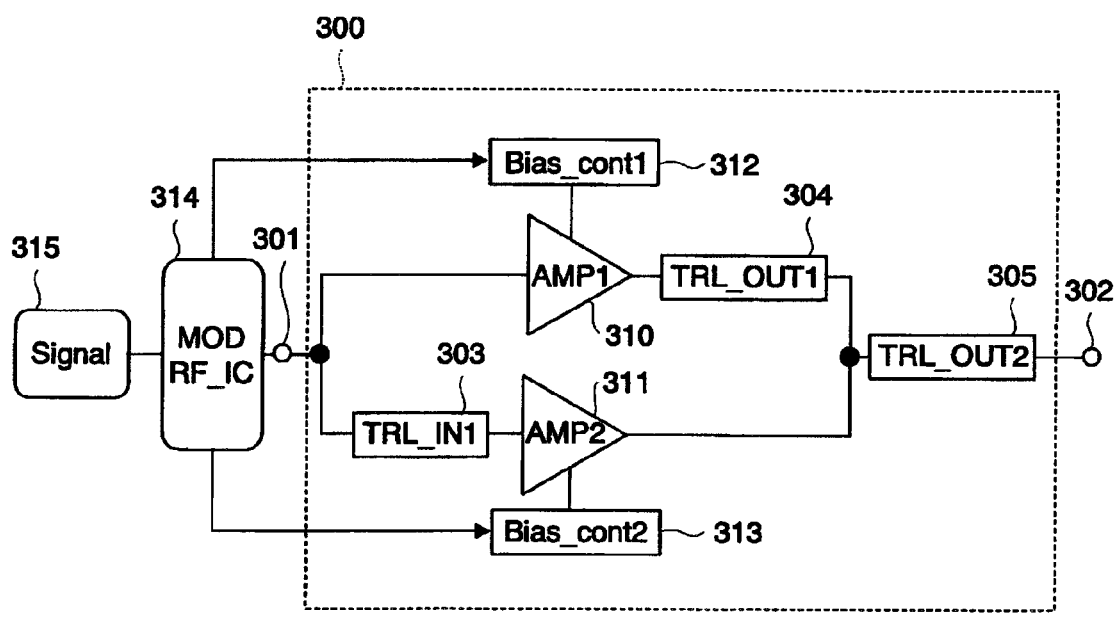
FIG. 22 is a block diagram showing a high-frequency power amplifier in accordance with Embodiment C of the invention.

FIG. 22 is a block diagram showing a high-frequency power amplifier in accordance with Embodiment C of the invention. The high-frequency power amplifier 300 in accordance with this embodiment includes: power amplifiers (AMP1) 310 and (AMP2) 311; bias control circuits (Bias_cont1) 312 and (Bias_cont2) 313; distributed parameter lines (TRL_IN1) 303, (TRL_OUT1) 304, and (TRL_OUT2) 305; a high-frequency signal input terminal 301; and a high-frequency signal output terminal 302. Further, the high-frequency power amplifier has an RF_IC part (MOD RF_IC) 314 including a signal modulation part and a signal source (Signal) 315 connected thereto from the outside.

As for the high-frequency power amplifier 300 in accordance with this embodiment, as in the case of Embodiment B shown in FIG. 21, a high-frequency signal to be input to the high-frequency signal input terminal 301 is sent from the external signal source 315 through the RF_IC part 314 including the signal modulation part to the input terminal. Therefore, the power amplifier obtains modulation signal information from the RF_IC part 314. In addition, a delay line composed of a distributed parameter line 303 is used for an input portion of the power amplifier 311 downstream of the point where the input signal line branches. Further, a delay line composed of a distributed parameter line 304 is used for an output portion of the power amplifier 310. A distributed parameter line 305 operable to perform impedance conversion into a desired impedance is provided downstream of the point where output portions of the distributed parameter line 304 and power amplifier 311 are connected together. Other operations are the same as those of the high-frequency power amplifier in accordance with Embodiment B.

Therefore, this embodiment can offer the same effects as those achieved by the Embodiment A. Further, in this embodiment, the distributed parameter lines 303, 304 and 305 are used for the input and output portions of the power amplifiers 310 and 311, which makes it possible to provide a high-frequency power amplifier resistant to the variation in load.

In the case where delay lines are used for input and output portions of the power amplifiers 311 and 310 as in the case of this embodiment, a lumped-parameter device may be used instead of each distributed parameter line. Also, in this case, the same effects can be achieved.

Embodiment D

Figure 23:
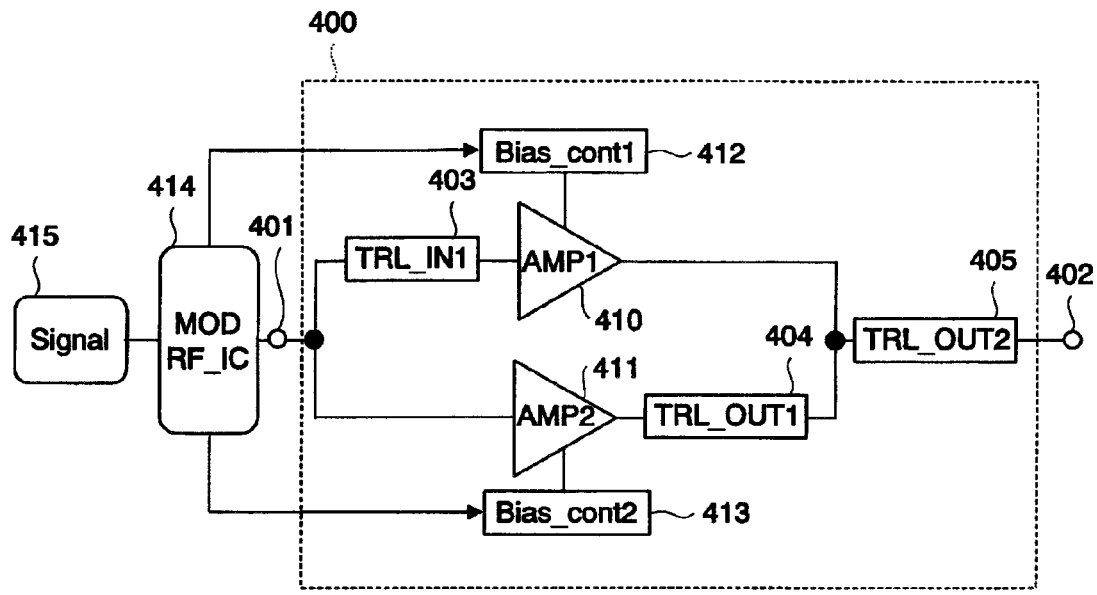
FIG. 23 is a block diagram showing a high-frequency power amplifier in accordance with Embodiment D of the invention.

FIG. 23 is a block diagram showing a high-frequency power amplifier in accordance with Embodiment D of the invention. The high-frequency power amplifier 400 in accordance with this embodiment includes: power amplifiers (AMP1) 410 and (AMP2) 411; bias control circuits (Bias_cont1) 412 and (Bias_cont2) 413; distributed parameter lines (TRL_IN1) 403, (TRL_OUT1) 404 and (TRL_OUT2) 405; a high-frequency signal input terminal 401; and a high-frequency signal output terminal 402. Further, the high-frequency power amplifier has an RF_IC part (MOD RF_IC) 414 including a signal modulation part and a signal source (Signal) 415 connected thereto from the outside.

The high-frequency power amplifier 400 in accordance with this embodiment differs from the high-frequency power amplifier in accordance with Embodiment C shown in FIG. 22 in that the delay line composed of the distributed parameter line 403 making an input portion of the high-frequency power amplifier is used for an input portion of the power amplifier 410, and the delay line composed of the distributed parameter line 404 making an output portion of the high-frequency power amplifier is used downstream of the power amplifier 411. Other operations are the same as those of the high-frequency power amplifier in accordance with Embodiment C.

Therefore, while in this embodiment, the locations of distributed parameter lines 403, 404 and 405 are different, the same effects as those achieved by Embodiment C can be offered.

Embodiment E

Figure 24:
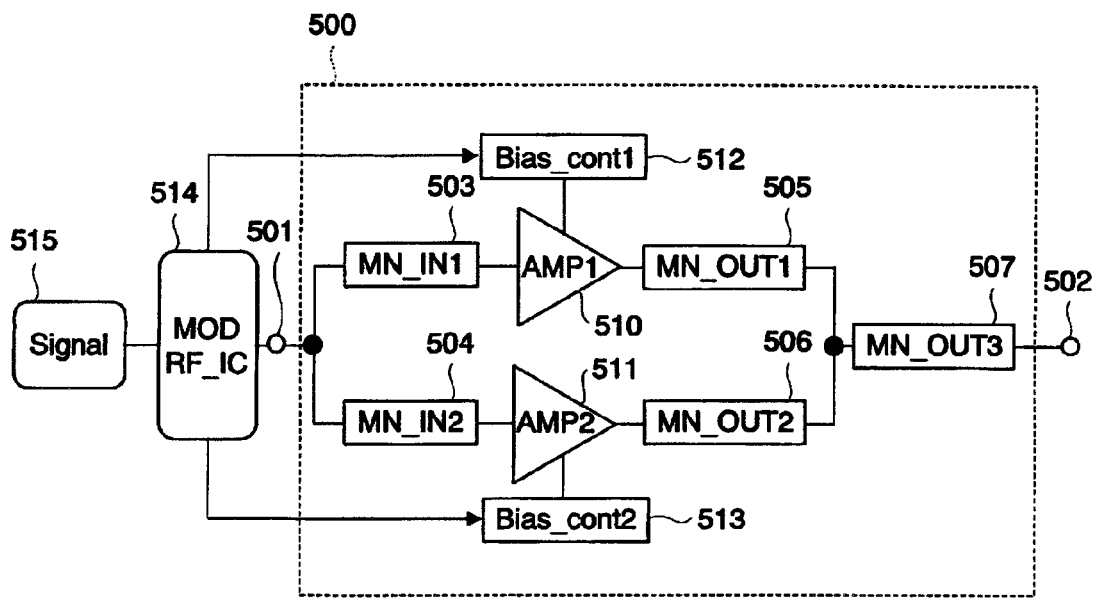
FIG. 24 is a block diagram showing a high-frequency power amplifier in accordance with Embodiment E of the invention.

FIG. 24 is a block diagram showing a high-frequency power amplifier in accordance with Embodiment E of the invention. The high-frequency power amplifier 500 in accordance with this embodiment includes: power amplifiers (AMP1) 510 and (AMP2) 511; bias control circuits (Bias_cont1) 512 and (Bias_cont2) 513; input matching circuits (MN_IN1) 503 and (MN_IN2) 504; output matching circuits (MN_OUT1) 505, (MN_OUT2) 506 and (MN_OUT3) 507; a high-frequency signal input terminal 501; and a high-frequency signal output terminal 502. Further, the high-frequency power amplifier has an RF_IC part (MOD RF_IC) 514 including a signal modulation part and a signal source (Signal) 515 connected thereto from the outside.

In the high-frequency power amplifier 500 in accordance with this embodiment, the input matching circuit 503 and the output matching circuit 505 are provided for the power amplifier 510; the input matching circuit 504 and the output matching circuit 506 are used for the power amplifier 511. In addition, the output matching circuit (MN_OUT3) 507 for performing matching with a desired impedance is provided downstream of the point where output portions of the output matching circuits 505 and 506 are connected together.

Further, as for the high-frequency power amplifier 500, phase changes caused in the input matching circuits 503 and 504, and the output matching circuits 505 and 506, which are used for the power amplifiers 510 and 511, do not necessarily coincide between the input matching circuits 503 and 505, and between the output matching circuits 505 and 506. There is no problem with such phase changes as long as the total amount of phase changes does not vary between a first route extending from the input matching circuit 503 through the power amplifier 510 to the output matching circuit 505 and a second route extending from the input matching circuit 504 through the power amplifier 511 to the output matching circuit 506. For example, in the case where the phase is −90° in the input matching circuit 503 and 0° in the input matching circuit 504, the first and second routes can be identical in phase to each other when the phase is 0° in the output matching circuit 505 and −90° in the output matching circuit 506.

Therefore, this embodiment can offer the same effects as those achieved by Embodiment A. Further, in this embodiment, the input matching circuits 503 and 504 and the output matching circuits 505, 506 and 507 are used for the input and output portions of the power amplifiers 510 and 511, which makes it possible to provide a high-frequency power amplifier resistant to the change in phase.

Embodiment F

Figure 25:
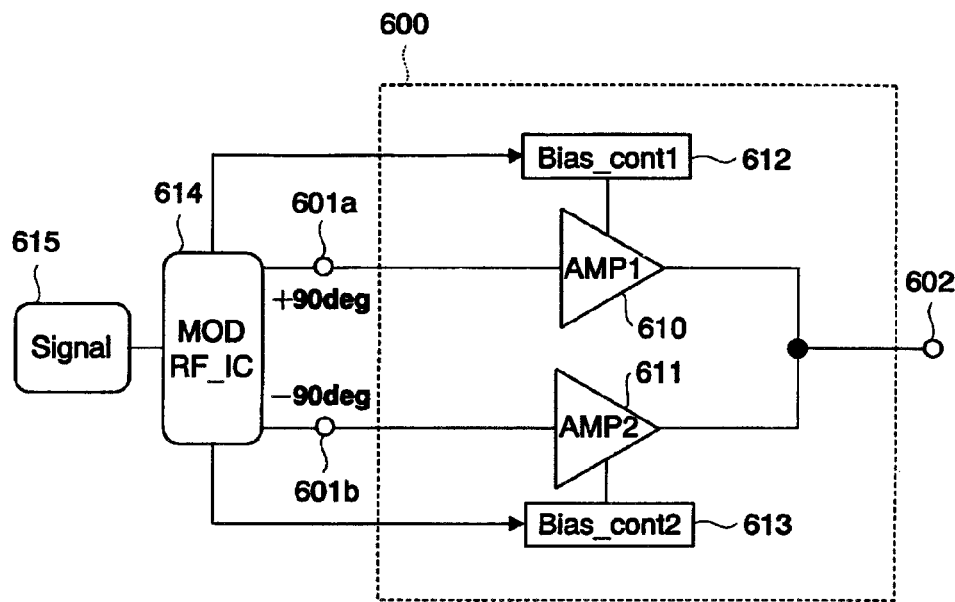
FIG. 25 is a block diagram showing a high-frequency power amplifier in accordance with Embodiment F of the invention.

FIG. 25 is a block diagram showing a high-frequency power amplifier in accordance with Embodiment F of the invention. The high-frequency power amplifier 600 in accordance with this embodiment includes: power amplifiers (AMP1) 610 and (AMP2) 611; bias control circuits (Bias_cont1) 612 and (Bias_cont2) 613; high-frequency signal input terminals 601a and 601b; and a high-frequency signal output terminal 602. Further, the high-frequency power amplifier has an RF_IC part (MOD RF_IC) 614 including a signal modulation part and a signal source (Signal) 615 connected thereto from the outside.

As for the high-frequency power amplifier 600 in accordance with this embodiment, an input terminal portion of the circuit in association with Embodiment B shown in FIG. 21 is replaced with a combination of the high-frequency signal input terminals 601a and 601b. Therefore, the high-frequency power amplifier operates on a differential input through the terminals 601a and 601b. However, the other operations thereof are the same as those of the high-frequency power amplifier in accordance with Embodiment B.

Therefore, this embodiment can offer the same effects as those achieved by Embodiment B. Further, in this embodiment, the high-frequency signal input terminals 601a and 601b are used instead of the input terminal portion of the high-frequency power amplifier shown in FIG. 21, which makes it possible to provide a high-frequency power amplifier which accommodates for a differential input.

Embodiment G

Figure 26:
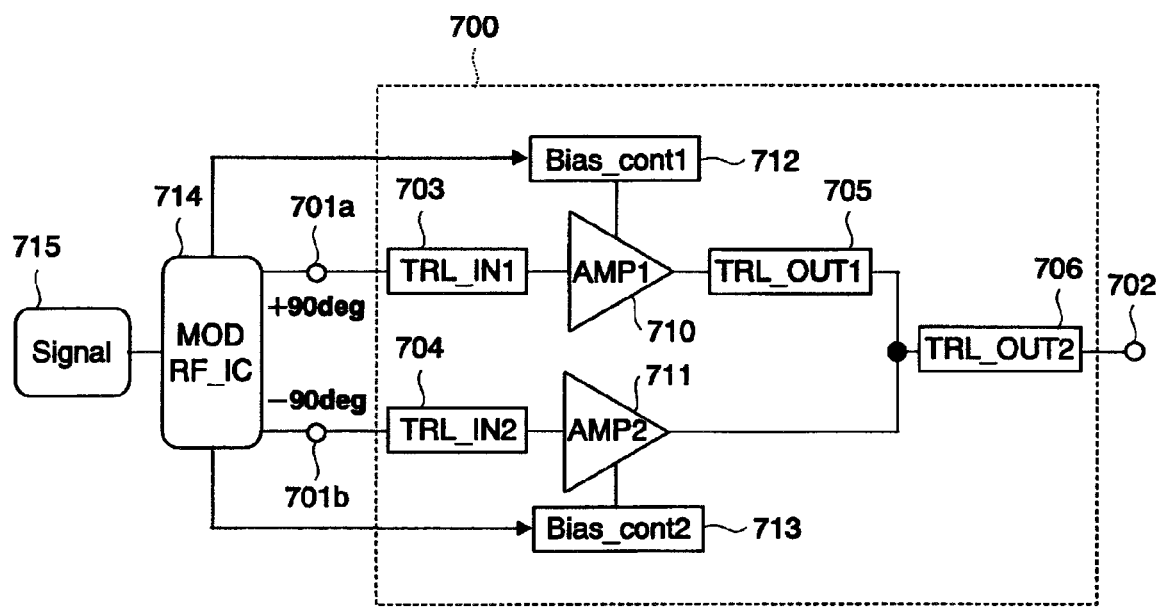
FIG. 26 is a block diagram showing a high-frequency power amplifier in accordance with Embodiment G of the invention.

FIG. 26 is a block diagram showing a high-frequency power amplifier in accordance with Embodiment G of the invention. The high-frequency power amplifier 700 in accordance with this embodiment includes: power amplifiers (AMP1) 710 and (AMP2) 711; bias control circuits (Bias_cont1) 712 and (Bias_cont2) 713; distributed parameter lines (TRL_IN1) 703, (TRL_IN2) 704, (TRL_OUT1) 705, and (TRL_OUT2) 706; high-frequency signal input terminals 701a and 701b; and a high-frequency signal output terminal 702. Further, the high-frequency power amplifier has an RF_IC part (MOD RF_IC) 714 including a signal modulation part and a signal source (Signal) 715 connected thereto from the outside.

In the high-frequency power amplifier 700 in accordance with this embodiment, an input terminal portion of the circuit in accordance with Embodiment C shown in FIG. 22 is replaced with a combination of the high-frequency signal input terminals 701a and 701b. Therefore, the high-frequency power amplifier operates on a differential input through the terminals 701a and 701b. A delay line composed of the distributed parameter line 703 and a delay line composed of the distributed parameter line 704 are used for input portions of the power amplifier 710 and the power amplifier 711 respectively. Further, a delay line composed of the distributed parameter line 705 is used for an output portion of the power amplifier 710. The distributed parameter line 706 operable to perform impedance conversion into a desired impedance is provided downstream of the point where the output portions of the distributed parameter line 705 and power amplifier 711 are connected together. Other operations thereof are the same as those of the high-frequency power amplifier in accordance with Embodiment C.

Therefore, this embodiment can offer the same effects as those achieved by Embodiment C. Further, in this embodiment, the high-frequency signal input terminals 701a and 701b are used instead of the input terminal portion of the high-frequency power amplifier shown in FIG. 22, which makes it possible to provide a high-frequency power amplifier which accommodates for a differential input.

Embodiment H

Figure 27:
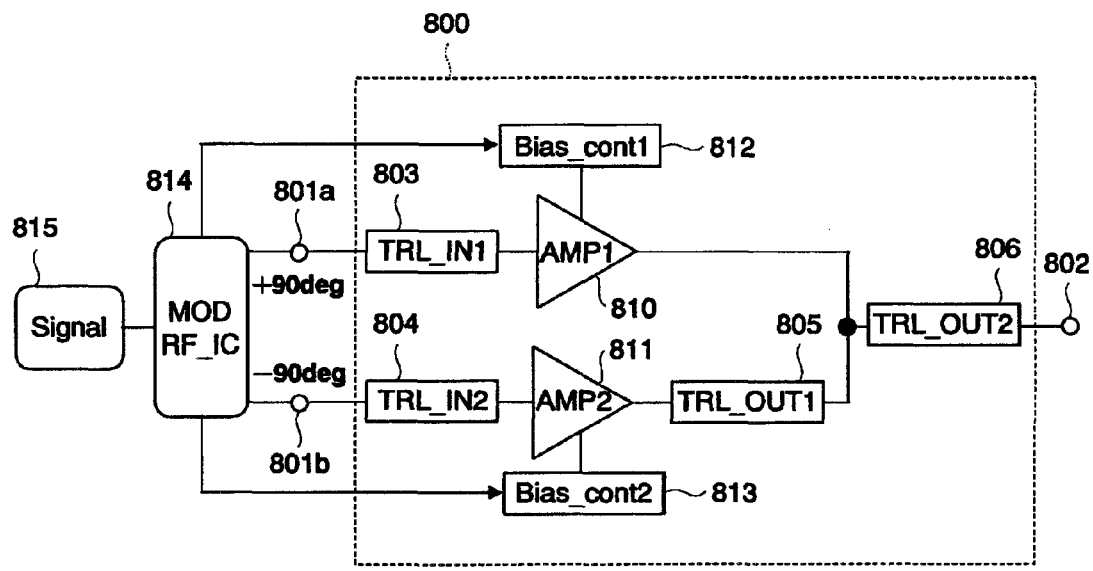
FIG. 27 is a block diagram showing a high-frequency power amplifier in accordance with Embodiment H of the invention.

FIG. 27 is a block diagram showing a high-frequency power amplifier in accordance with Embodiment H of the invention. The high-frequency power amplifier 800 in accordance with this embodiment includes: power amplifiers (AMP1) 810 and (AMP2) 811; bias control circuits (Bias_cont1) 812 and (Bias_cont2) 813; distributed parameter lines (TRL_IN1) 803, (TRL_IN2) 804, (TRL_OUT1) 805, and (TRL_OUT2) 806; high-frequency signal input terminals 801a and 801b; and a high-frequency signal output terminal 802. Further, the high-frequency power amplifier has an RF_IC part (MOD RF_IC) 814 including a signal modulation part and a signal source (Signal) 815 connected thereto from the outside.

Unlike the high-frequency power amplifier in accordance with Embodiment G shown in FIG. 26, in the high-frequency power amplifier 800, the distributed parameter line (TRL_OUT1) 805 is used for an output portion of the power amplifier 811. Operations thereof are the same as those of the high-frequency power amplifier in accordance with Embodiment G.

Therefore, this embodiment can offer the same effects as those achieved by the Embodiment G.

Embodiment I

Figure 28:
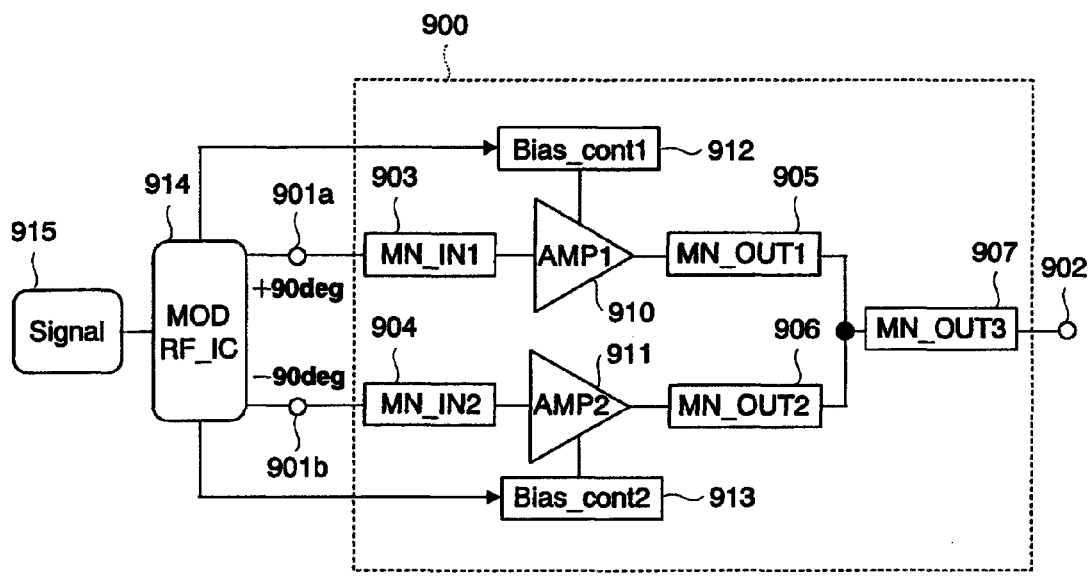
FIG. 28 is a block diagram showing a high-frequency power amplifier in accordance with Embodiment I of the invention.

FIG. 28 is a block diagram showing a high-frequency power amplifier in accordance with Embodiment I of the invention. The high-frequency power amplifier 900 in accordance with this embodiment includes: power amplifiers (AMP1) 910 and (AMP2) 911; bias control circuits (Bias_cont1) 912 and (Bias_cont2) 913; input matching circuits (MN_IN1) 903 and (MN_IN2) 904; output matching circuits (MN_OUT1) 905, (MN_OUT2) 906, and (MN_OUT3) 907; high-frequency signal input terminals 901a and 901b; and a high-frequency signal output terminal 902. Further, the high-frequency power amplifier has an RF_IC part (MOD RF_IC) 914 including a signal modulation part and a signal source (Signal) 915 connected thereto from the outside.

In the high-frequency power amplifier 900 in accordance with this embodiment, an input terminal portion of the circuit in accordance with Embodiment E shown in FIG. 24 is replaced with a combination of the high-frequency signal input terminals 901a and 901b. Therefore, the high-frequency power amplifier operates on a differential input through the terminals 901a and 901b. Other operations thereof are the same as those of the high-frequency power amplifier in accordance with Embodiment E.

Therefore, this embodiment can offer the same effects as those achieved by Embodiment E, and can provide a high-frequency power amplifier which accommodates for a differential input.

Embodiment J

Figure 29:
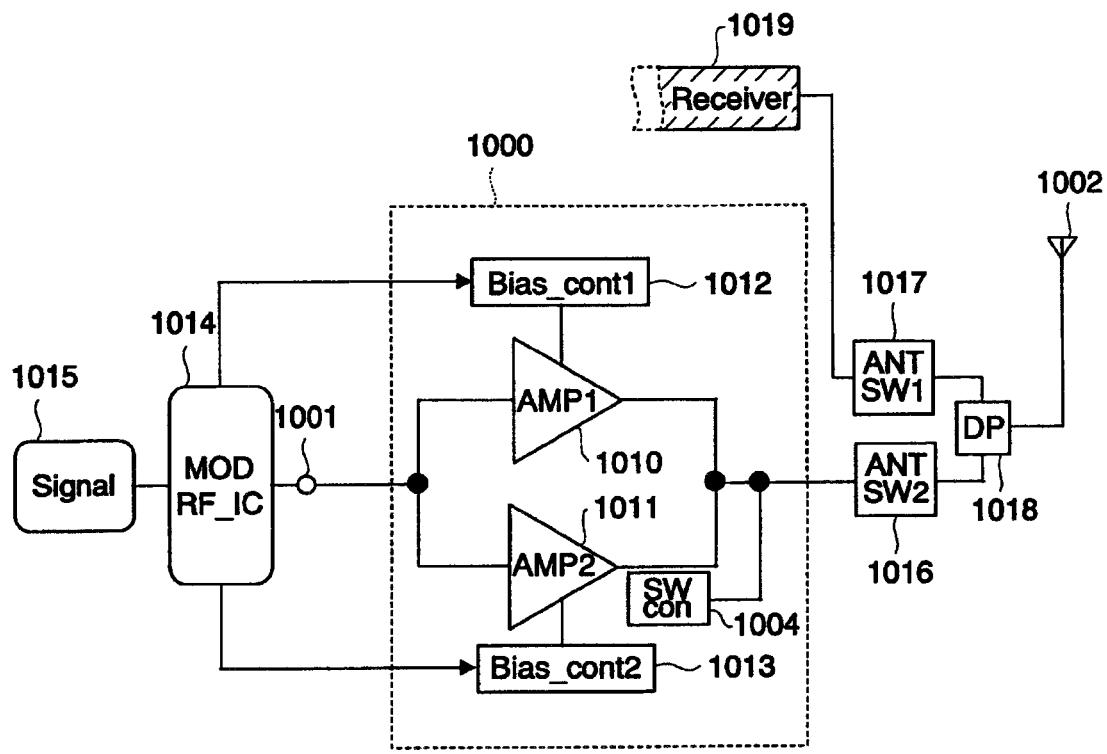
FIG. 29 is a block diagram showing a high-frequency power amplifier in accordance with Embodiment J of the invention and a transmitter-receiver using the same.

FIG. 29 is a block diagram showing a high-frequency power amplifier in accordance with Embodiment J of the invention. The high-frequency power amplifier 1000 in accordance with this embodiment includes: power amplifiers (AMP1) 1010 and (AMP2) 1011; bias control circuits (Bias_cont1) 1012 and (Bias_cont2) 1013; a switch control circuit (SW con) 1004; and a high-frequency signal input terminal 1001. Further, the high-frequency power amplifier has an RF_IC part (MOD RF_IC) 1014 including a signal modulation part and a signal source (Signal) 1015 connected on its input side from the outside. In addition, on its output side are connected antenna switches (ANT_SW2) 1016 and (ANT_SW1) 1017, a duplexer 1018, and an antenna 1002. FIG. 29 shows a transmitter-receiver such as a portable phone terminal, which has a high-frequency power amplifier 1000 of a transmitter circuit, a front end part including a switch and a duplexer, and a receiver circuit 1019.

In the high-frequency power amplifier 1000 in accordance with this embodiment, on its transmitter side, high-frequency signal outputs sent out from the power amplifiers 1010 and 1011 go through the antenna switch 1016 and the duplexer 1018 and reaches the antenna 1002. On the receiver side, a signal received through the antenna 1002 goes through the duplexer 1018 and the antenna switch 1017 and reaches the receiver circuit 1019. In this process, the operation of supplying the antenna switches 1016 and 1017 with a DC bias for the operation of switching the antenna through a high-frequency signal line is executed. Specifically, the switch control circuit 1004 superposes information for controlling activation and deactivation of the antenna switches 1016 and 1017 for the purpose of cutting a route to the antenna 1002 on an output signal. Other operations are the same as those of the high-frequency power amplifier in accordance with Embodiment B.

Therefore, this embodiment can offer the same effects as those achieved by Embodiment B. Further, in this embodiment, a transmitter circuit and a receiver circuit are arranged, which makes it possible to provide a transmitter-receiver incorporating the high-frequency power amplifier.

Embodiment K

Figure 30:
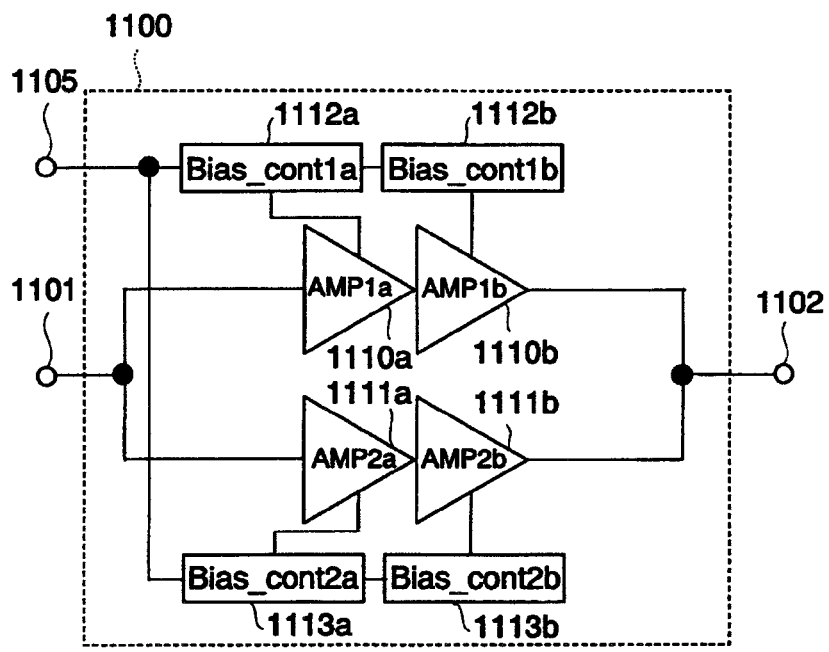
FIG. 30 is a block diagram showing a high-frequency power amplifier in accordance with Embodiment K of the invention.

FIG. 30 is a block diagram showing a high-frequency power amplifier in accordance with Embodiment K of the invention. The high-frequency power amplifier 1100 in accordance with this embodiment includes: power amplifiers (AMP1a) 1110a, (AMP1b) 1110b, (AMP2a) 1111a, and (AMP2b) 1111b; bias control circuits (Bias_cont1a) 1112a, (Bias_cont1b) 1112b, (Bias_cont2a) 1113a, and (Bias_cont2b) 1113b; a high-frequency signal input terminal 1101; a high-frequency signal output terminal 1102; and a modulation signal information input terminal 1105.

Figures 31, 32, 33:
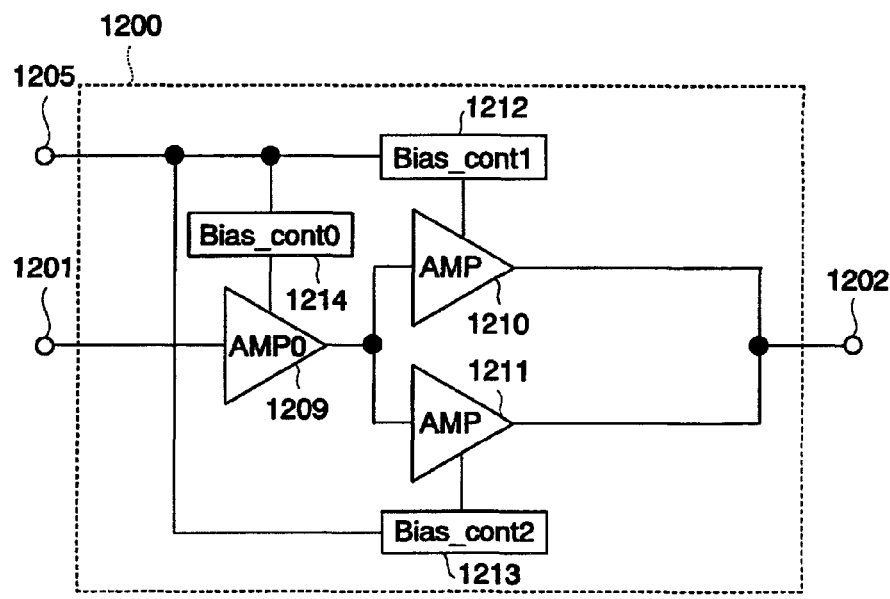
FIG. 31 is a table showing biasing conditions in modulation in bias control circuits in the high-frequency power amplifier in accordance with Embodiment K of the invention.
FIG. 32 is a block diagram showing a high-frequency power amplifier in accordance with Embodiment L of the invention.
FIG. 33 is a table showing biasing conditions in modulation in bias control circuits in the high-frequency power amplifier in accordance with Embodiment L of the invention.
Figure 34:
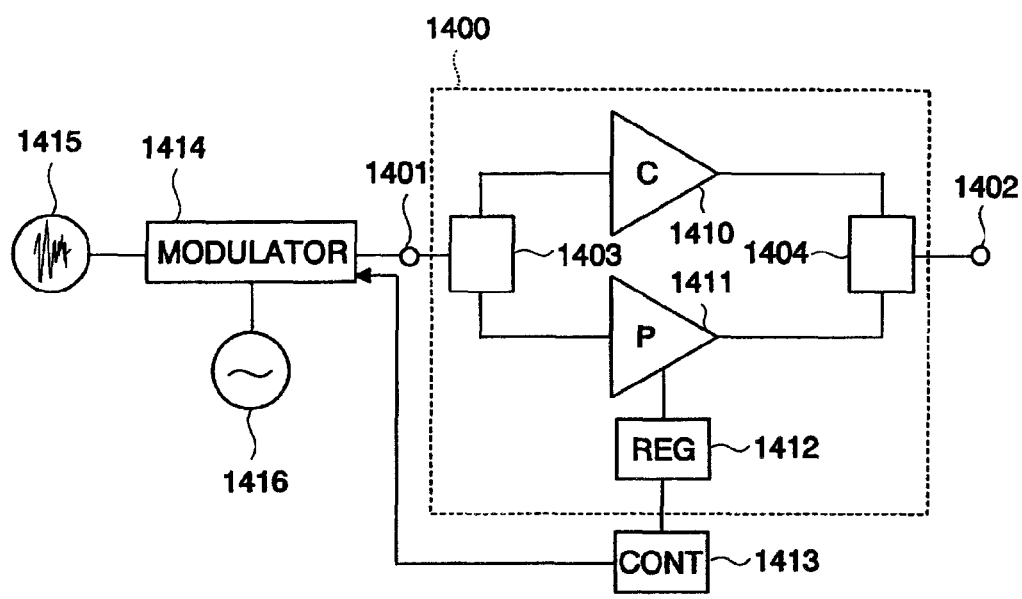
FIG. 34 is a block diagram showing a conventional high-frequency power amplifier.
Figure 35:
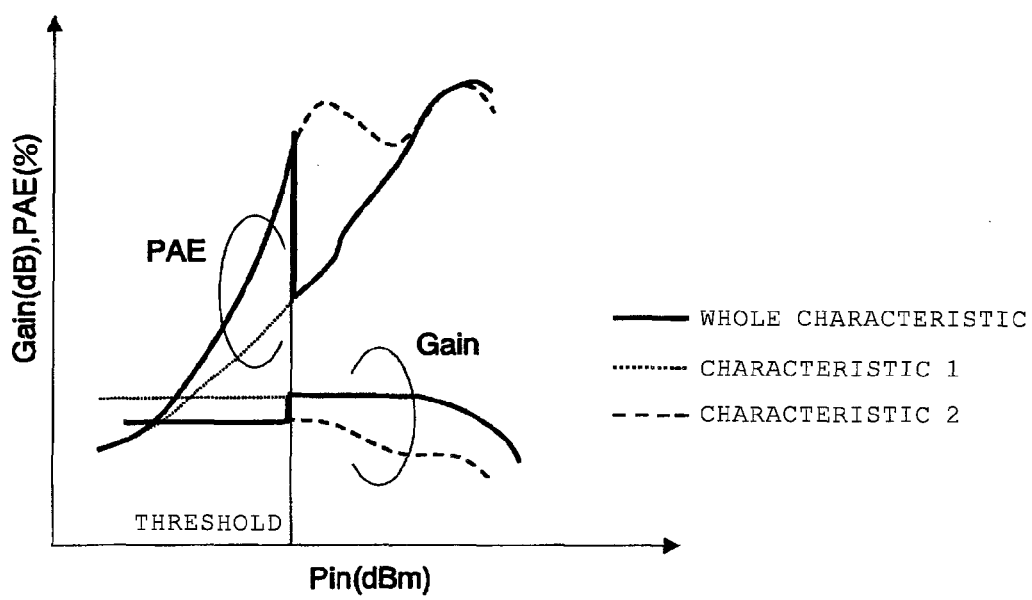
FIG. 35 is a plot showing an input power vs. power gain curve and an input power vs. power-added efficiency curve of the conventional high-frequency power amplifier.

The high-frequency power amplifier 1100 in accordance with this embodiment takes a multistage form, whose circuit can be arranged by replacing the power amplifiers (AMP1) 110 and (AMP2) 111 of the circuit in accordance with Embodiment A shown in FIG. 18 with a combination of the first-stage and second-stage power amplifiers 1110a and 1110b, and a combination of the first-stage and second-stage power amplifiers 1111a and 1111b respectively. In this embodiment, the biasing conditions of the individual power amplifiers are set as shown in FIG. 31. Specifically, in the case of the linear amplification mode, the biases of the power amplifiers 1110a and 1110b and power amplifiers 1111a and 1111b are set to be common to the power amplifiers and to make the power amplifiers operational in one of Classes A to B. In the case of the nonlinear amplification mode, the bias of one of a combination of power amplifiers 1110a and 1110b and a combination of power amplifiers 1111a and 1111b (the combination of the power amplifiers 1111a and 1111b, here) is changed, and set so that the one combination of power amplifiers become operational in one of Classes B to C.

While an example of two-stage amplifiers is taken here, the same thing can be said even when the power amplifier is constituted by two or more stages. Further, the basic operations are the same as those in the Embodiment A.

Therefore, this embodiment can offer the same effects as those achieved by Embodiment A. Further, in this embodiment, each power amplifier is made multistage one by arranging a combination of first-stage and second-stage power amplifiers 1110a and 1110b for a functional unit and arranging a combination of first-stage and second-stage power amplifiers 1111a and 1111b for another functional unit, for example. This makes it possible to provide a high-frequency power amplifier which can be fabricated in a multistage form.

Embodiment L

FIG. 32 is a block diagram showing a high-frequency power amplifier in accordance with Embodiment L of the invention. The high-frequency power amplifier 1200 in accordance with this embodiment includes: power amplifiers (AMP0) 1209, (AMP1) 1210 and (AMP2) 1211; bias control circuits (Bias_cont0) 1214, (Bias_cont1) 1212 and (Bias_cont2) 1213; a high-frequency signal input terminal 1201; a high-frequency signal output terminal 1202; and a modulation signal information input terminal 1205.

The high-frequency power amplifier 1200 in accordance with this embodiment has a structure of a multistage amplifier like the circuit in accordance with Embodiment K shown in FIG. 30. In the high-frequency power amplifier 1200, circuit components to the first-stage power amplifier 1209 are shared, however after that the line is divided into the one toward the second-stage power amplifier 1210 and the one for the power amplifier 1211. While in this embodiment, the bias control circuit 1214 controls the bias of the first-stage power amplifier 1209 independently of the biases of the power amplifiers 1210 and 1211 in the second stage, the bias of the first-stage power amplifier 1209 may be controlled to be coincident with the biases controlled by the bias control circuit 1212 and the bias control circuit 1213. In this embodiment, the biasing conditions of the individual power amplifiers are set as shown in FIG. 33. Specifically, in the case of the linear amplification mode, the biases of the power amplifiers 1209, 1210, and 1211 are set to be common to the power amplifiers and to make the power amplifiers operational in one of Classes A to B. Further, in the case of the nonlinear amplification mode, the bias of the power amplifier 1211 is changed and set so that the power amplifier 1211 is made operational in one of Classes B to C.

Now, it is noted that the power amplifier 1209 of the first stage, and the power amplifiers 1210 and 1211 of the second stage may be multistage amplifiers each composed of two stages or more.

Therefore, this embodiment can offer the same effects as those achieved by Embodiment K.

While the invention made by the inventor has been described above based on the embodiments specifically, the invention is not so limited. It is needless to say that various changes and modifications may be made without departing from the scope of the invention.

For example, with the RF power amplifier shown in FIG. 8, aside from the power coupler PCPL for detecting a transmission output power level, which detects a transmission power of the RF power amplifier, a current sensing detector can be adopted. When a current sensing detector is used, a detector-and-amplifier device is connected in parallel with the final-stage power amplification device of the RF power amplifier, and a small detecting DC/AC operating current in proportion to DC/AC operating current of the final-stage power amplification device is passed through the detector-and-amplifier device.

The first and second amplification devices Q1 and Q2 may be each replaced with an N-channel field effect transistor of MESFET or HEMT composed of a compound semiconductor such as GaAs and InP.

What is claimed is:

1. An RF power amplifier comprising:
   a first amplification device;
   a second amplification device; and
   a third amplification device,
   wherein the first to third amplification devices are formed on a common semiconductor chip as final-stage amplification power devices connected in parallel between an input terminal and an output terminal,
   an input electrode of the third amplification device is connected with an input electrode of the first amplification device through a switching device,
   when an RF power output is at Low level, the switching device is controlled to be in OFF state, whereby the third amplification device is controlled to be in OFF state,
   when the RF power output is at Low level, a first bias voltage of an input terminal of the first amplification device is set to be higher than a second bias voltage of an input terminal of the second amplification device so that the first amplification device is operational in any one of operating classes between Class B with a conduction angle of $\pi$ (180°) and Class AB with a conduction angle of $\pi$ (180°) to $2\pi$ (360°), and the second amplification device is operational in Class C with a conduction angle below $\pi$ (180°), and
   when the RF power output is at High level, the switching device is controlled to be in ON state,
   when the RF power output is at High level, (1) a first bias voltage of an input terminal of the first amplification device and an input terminal of the third amplification device, and (2) the second bias voltage of the input terminal of the second amplification device are set so that the first and third amplification devices are operational in any one of operating classes between Class B with a conduction angle of $\pi$ (180°) and Class AB with a conduction angle of $\pi$ (180°) to $2\pi$ (360°), and the second amplification device is also operational in any one of operating classes between Class B with a conduction angle of $\pi$ (180°) and Class AB with a conduction angle of $\pi$ (180°) to $2\pi$ (360°),
   a first effective device size of the first amplification device and a third effective device size of the third amplification device are set to be substantially identical to each other, but intentionally smaller than a second effective device size of the second amplification device beyond a range of a manufacturing error of the semiconductor chip.

2. The RF power amplifier of claim 1, further comprising:
   RF drive-and-amplification stages for driving the final-stage amplification power devices; and
   a power supply circuit which is supplied with an external source voltage, and which supplies a first source voltage controlled in response to a level of a transmission level-specifying signal to the first and third amplification devices, and supplies a controlled second source voltage to the second amplification device.

3. The RF power amplifier of claim 2, wherein the first source voltage is supplied to an output electrode of the first amplification device and an output electrode of the third amplification device through a first load device,
the second source voltage is supplied to an output electrode of the second amplification device through a second load device, and
the power supply circuit works so that a level of the first source voltage reduces in response to reduction in level of an output power of the RF power amplifier.

4. The RF power amplifier of claim 2, wherein the first source voltage is supplied to an output electrode of the first amplification device and an output electrode of the third amplification device through a first load device,
the second source voltage is supplied to an output electrode of the second amplification device through a second load device, and
the power supply circuit works so that a level of the second source voltage rises in response to rise of an output power of the RF power amplifier.

5. The RF power amplifier of claim 2, wherein the power supply circuit includes a DC-DC converter composed of a switching regulator.

6. The RF power amplifier of claim 3, further comprising:
a power detector for detecting a level in connection with the output power from the output terminal;
an error amplifier for producing an automatic power control signal when being supplied with the transmission level-specifying signal and a power detection signal of the power detector;
driving input bias circuits for controlling the level of driving input bias voltages of the RF drive-and-amplification stages in response to the automatic power control signal produced by the error amplifier; and
final-stage input bias circuits for controlling the levels of final-stage input bias voltages of the first to third amplification devices as the final-stage amplification power devices in response to the automatic power control signal produced by the error amplifier.

7. The RF power amplifier of claim 1, wherein the switching device is a MEMS switch formed on the semiconductor chip.

8. The RF power amplifier of claim 1, wherein first to third amplification devices are each a field effect transistor.

9. The RF power amplifier of claim 8, wherein the field effect transistor is an LDMOS.

10. The RF power amplifier of claim 1, wherein the first to third amplification devices are each a bipolar transistor.

11. The RF power amplifier of claim 10, wherein the bipolar transistor is of a heterojunction type.

12. The RF power amplifier of claim 1, wherein the first effective device size of the first amplification device and the third effective device size of the third amplification device are set to be substantially half of the second effective device size of the second amplification device.

13. The RF power amplifier of claim 6, wherein the semiconductor chip with the first to third amplification devices formed thereon, the power detector and the error amplifier, and the DC-DC converter are incorporated in an RF power module package.

* * * * *